(12) United States Patent
Choi et al.

(10) Patent No.: US 12,153,469 B2
(45) Date of Patent: Nov. 26, 2024

(54) DISPLAY DEVICE AND METHOD FOR MANUFACTURING THE SAME

(71) Applicant: SAMSUNG DISPLAY CO., LTD., Yongin-Si (KR)

(72) Inventors: Jin Hwan Choi, Seoul (KR); Hyunwoo Koo, Hwaseong-si (KR); Taewoong Kim, Seongnam-si (KR); Dongwon Choi, Seoul (KR); Hayk Khachatryan, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 13 days.

(21) Appl. No.: 17/623,884

(22) PCT Filed: Nov. 15, 2019

(86) PCT No.: PCT/KR2019/015626
§ 371 (c)(1),
(2) Date: Dec. 30, 2021

(87) PCT Pub. No.: WO2021/020655
PCT Pub. Date: Feb. 4, 2021

(65) Prior Publication Data
US 2022/0357775 A1    Nov. 10, 2022

(30) Foreign Application Priority Data
Jul. 30, 2019   (KR) .......................... 10-2019-0092412

(51) Int. Cl.
*G06F 1/16*   (2006.01)

(52) U.S. Cl.
CPC .......... *G06F 1/1652* (2013.01); *G06F 1/1656* (2013.01)

(58) Field of Classification Search
CPC combination set(s) only.
See application file for complete search history.

(56) References Cited

U.S. PATENT DOCUMENTS

| 8,493,726 B2 | 7/2013 | Msser et al. |
| 8,516,728 B2 * | 8/2013 | Jung ...................... G09F 9/301 |
| | | 40/607.01 |

(Continued)

FOREIGN PATENT DOCUMENTS

| CN | 101689066 A | 3/2010 |
| CN | 102239683 A | 11/2011 |

(Continued)

OTHER PUBLICATIONS

International Search Report dated Apr. 29, 2020 for PCT/KR2019/015626.

(Continued)

*Primary Examiner* — Lisa Lea-Edmonds
(74) *Attorney, Agent, or Firm* — CANTOR COLBURN LLP

(57) ABSTRACT

A display device includes a display module, a plurality of support bars disposed on a rear surface of the display module, a roller which is connected to one end of the display module and around which the display module and part of the plurality of support bars are wound, and a housing which accommodates the display module, the plurality of support bars, and the roller. A gap between the plurality of support bars varies according to areas of the display module.

23 Claims, 22 Drawing Sheets

(56) References Cited

U.S. PATENT DOCUMENTS

| | | | |
|---|---|---|---|
| 9,019,696 B2 | 4/2015 | Hamers et al. | |
| 9,195,272 B2* | 11/2015 | O'Brien | H04M 1/0268 |
| 9,940,892 B2 | 4/2018 | Pang | |
| 10,175,792 B2 | 1/2019 | Kim et al. | |
| 10,257,945 B2 | 4/2019 | Kim et al. | |
| 10,466,748 B2* | 11/2019 | Choi | G09F 9/301 |
| 10,540,026 B2 | 1/2020 | Park | |
| 10,622,420 B2 | 4/2020 | Choi et al. | |
| 10,671,124 B2* | 6/2020 | Kim | H05K 5/0017 |
| 10,948,630 B2 | 3/2021 | Kim et al. | |
| 11,016,532 B2* | 5/2021 | Yang | H04M 1/0268 |
| 11,140,790 B2* | 10/2021 | Kim | H05K 5/0017 |
| 11,194,363 B2* | 12/2021 | Kim | G06F 1/1652 |
| 11,619,975 B2* | 4/2023 | Cai | G06F 1/1652 |
| | | | 361/679.01 |
| 11,630,490 B2* | 4/2023 | Kim | G09F 9/301 |
| | | | 361/679.02 |
| 11,755,074 B2* | 9/2023 | Hong | H04M 1/0235 |
| | | | 361/679.01 |
| 2012/0204453 A1* | 8/2012 | Jung | G09F 9/301 |
| | | | 40/517 |
| 2017/0060183 A1* | 3/2017 | Zhang | G06F 1/1615 |
| 2017/0278436 A1* | 9/2017 | Chu | H10K 77/111 |
| 2017/0364122 A1 | 12/2017 | Kim et al. | |
| 2020/0060028 A1* | 2/2020 | Kim | H04M 1/0268 |
| 2021/0272486 A1* | 9/2021 | Khachatryan | G09F 9/301 |
| 2022/0057843 A1* | 2/2022 | Kim | G06F 1/1637 |
| 2022/0327970 A1* | 10/2022 | Park | G09F 9/301 |
| 2022/0357775 A1* | 11/2022 | Choi | H04M 1/0268 |
| 2023/0244279 A1* | 8/2023 | Kim | G06F 1/1624 |
| | | | 361/679.02 |

FOREIGN PATENT DOCUMENTS

| | | |
|---|---|---|
| CN | 103963389 A | 8/2014 |
| CN | 104536531 A | 4/2015 |
| CN | 105869522 A | 8/2016 |
| CN | 108091261 A | 5/2018 |
| CN | 109377876 A | 2/2019 |
| CN | 109411620 A | 3/2019 |
| CN | 110021235 A | 7/2019 |
| EP | 1830336 A1 | 9/2007 |
| EP | 3503196 A2 | 6/2019 |
| EP | 3503196 A3 | 10/2019 |
| KR | 1020100017284 A | 2/2010 |
| KR | 1020160098677 A | 8/2016 |
| KR | 1020170124120 A | 11/2017 |
| KR | 1020190084188 A | 7/2019 |

OTHER PUBLICATIONS

Extended European Search Report for Application No. 19939807.4-1224 dated Oct. 30, 2023 enumerating the above listed references.

* cited by examiner

FIG. 1
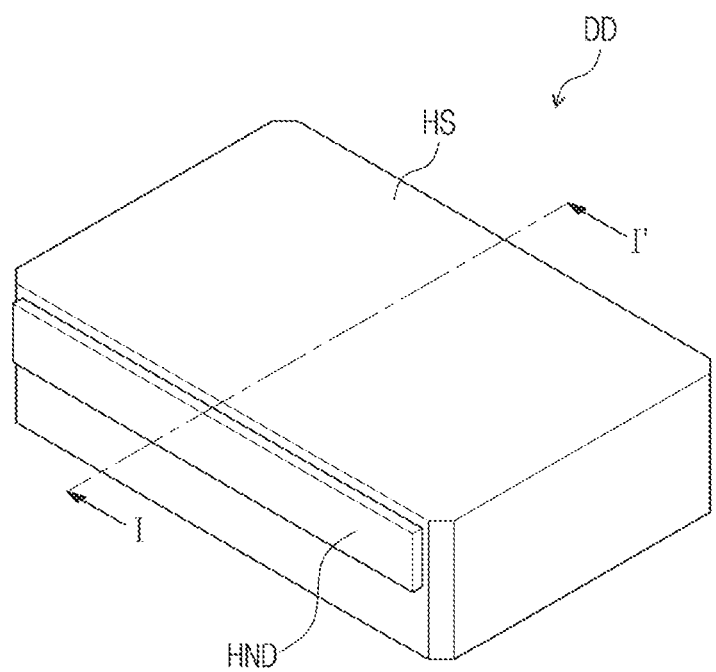
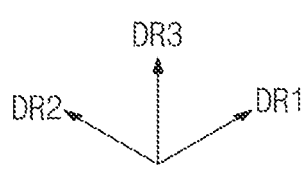

FIG. 17
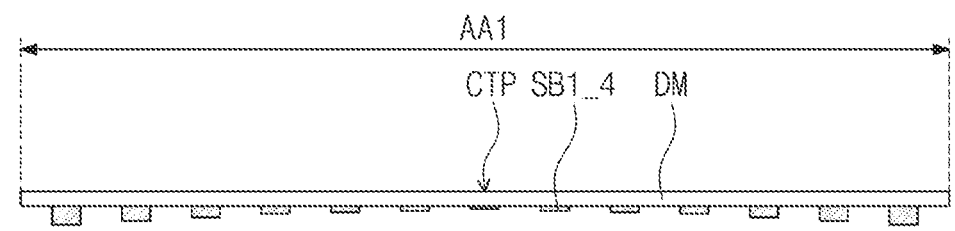
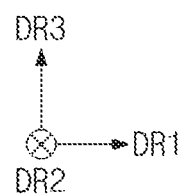
FIG. 18
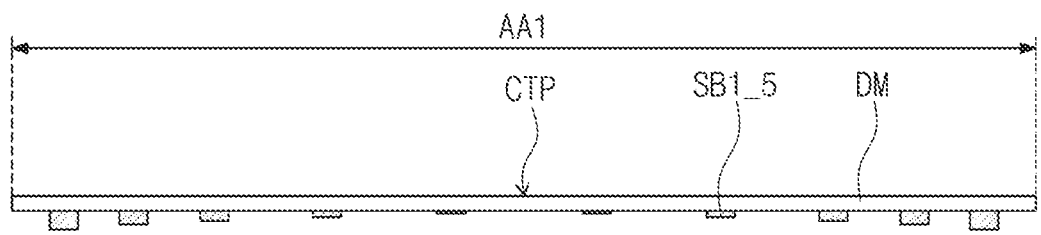
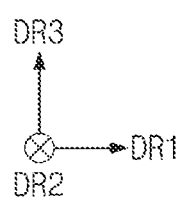

FIG. 19
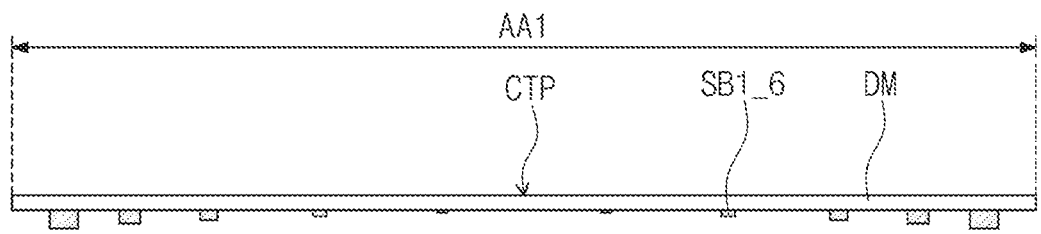
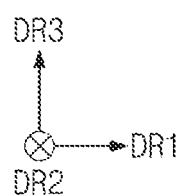
FIG. 20
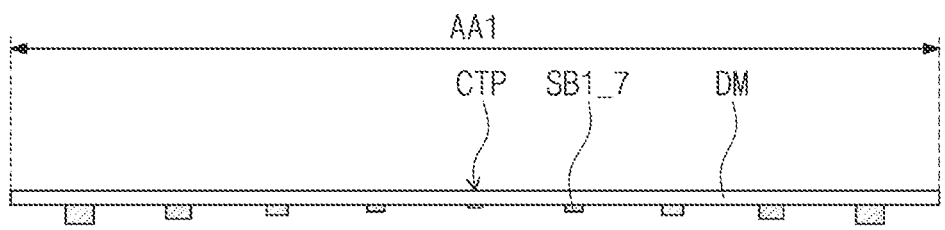
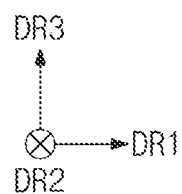

DISPLAY DEVICE AND METHOD FOR MANUFACTURING THE SAME

TECHNICAL FIELD

The present invention relates to a display device and a method for manufacturing the same.

BACKGROUND ART

Electronic equipment for providing an image to a user such as smartphones, digital cameras, laptop computers, navigations, and smart televisions includes a display device for displaying an image. The display device generates an image to provide the image to the user through a display screen.

Various types of display devices have been developed with the development of technology of display devices. For example, various flexible display devices that are deformed into a curved shape, folded, or rolled are being developed. The flexible display device may be easily carried and improve user's convenience.

DISCLOSURE OF THE INVENTION

Technical Problem

A rollable display device of flexible display devices may include a display module wound around a roller and a support supporting the display module. When the display module is wound around the roller, stress may be generated in the display module. A technique for reducing such stress is desirable.

An aspect of the present invention is to provide a display device that is capable of reducing stress generated in a display module.

Another aspect of the present invention is to provide a method for manufacturing a display device capable of improving a surface quality of a display module.

Technical Solution

A display device according to an embodiment of the present invention includes a display module, a plurality of support bars disposed on a rear surface of the display module, a roller which is connected to one end of the display module and around which the display module and part of the plurality of support bars are wound, and a housing which accommodates the display module, the plurality of support bars, and the roller. A gap between the plurality of support bars varies according to areas of the display module.

A display device according to an embodiment of the present invention includes a display module extending in a first direction, a plurality of support bars disposed on a rear surface of the display module, extending in a second direction crossing the first direction, and arranged to be spaced apart from each other in the first direction, a roller which is connected to one end of the display module and around which the display module and part of the plurality of support bars are wound, and a housing which accommodates the display module, the support bars, and the roller, where an opening, through which the display module and the support bars are inserted and withdrawn, is defined in the housing, and thicknesses of the plurality of support bars vary according to areas of the display module.

A method for manufacturing a display device according to an embodiment of the present invention includes: forming a plurality of grooves, which are arranged in a first direction and extend in a second direction crossing the first direction, in a first surface of a support plate, attaching a protective layer to a second surface of the support plate, which is an opposite surface of the first surface, applying tensile force to the protective layer and the support plate to cut portions of the support plate, in which the plurality of grooves are formed, so that a plurality of support bars spaced apart from each other in the first direction are formed, and attaching a display panel to a top surface of the protective layer, which is an opposite surface of a bottom surface of the protective layer, where the plurality of support bars are attached to the bottom surface.

Advantageous Effects

According to the embodiment of the present invention, since the gap between the support bars disposed on the first area of the display module wound around the roller gradually increases toward the central portion of the first area, the stress of the display module wound around the roller may be effectively reduced.

In addition, after the grooves are formed in the first surface of the support plate, and the protective layer is attached to the second surface of the flat support plate, the portions of the support plate, in which the grooves are formed, may be cut to form the support bars to improve the surface quality of the display module.

BRIEF DESCRIPTION OF THE DRAWINGS

FIG. 1 is a perspective view of a display device according to an embodiment of the present invention.

FIGS. 17 to 20 are views illustrating thicknesses of support bars according to various embodiments of the present invention.

MODE FOR CARRYING OUT THE INVENTION

Figure 2:
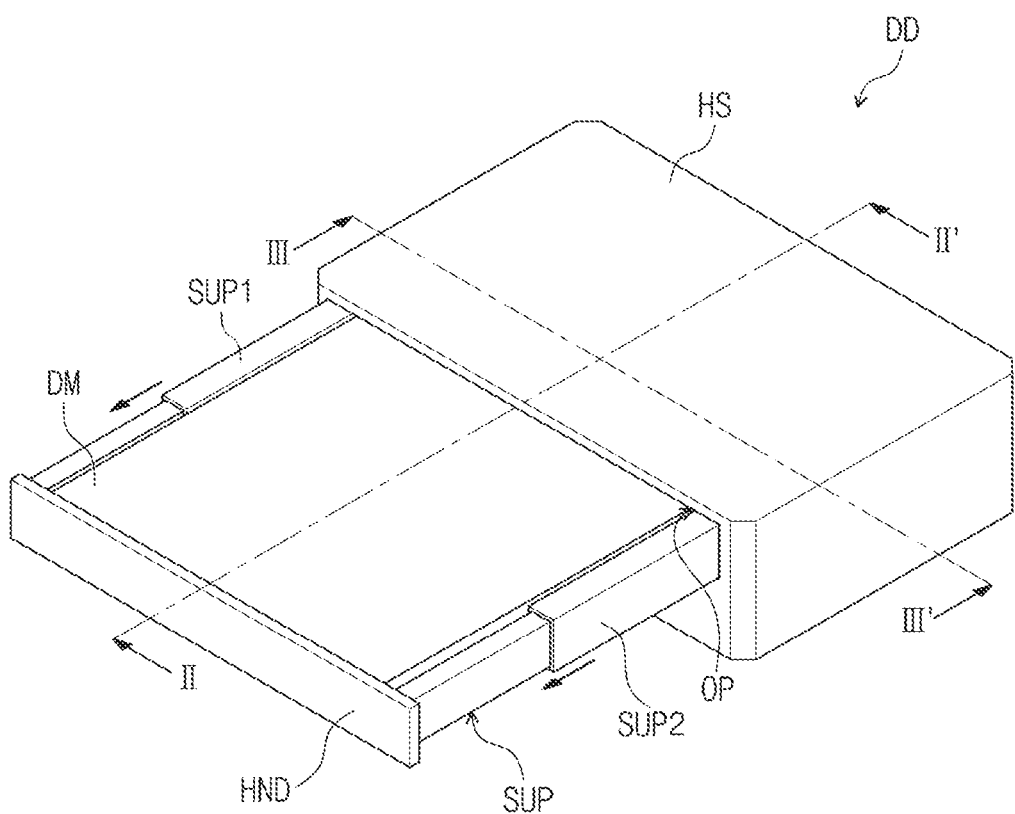
FIG. 2 is a view of a display module withdrawn from a housing illustrated in FIG. 1.

In this specification, it will also be understood that when one component (or area, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which the present invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the present invention will be described in detail with reference to the accompanying drawings.

FIG. 1 is a perspective view of a display device according to an embodiment of the present invention. FIG. 2 is a view of a display module withdrawn from a housing illustrated in FIG. 1.

Referring to FIGS. 1 and 2, a display device DD according to an embodiment of the present invention includes a housing HS, a display module DM accommodated in the housing HS, and a handle FIND connected to the display module DM, and a support SUP adjacent to each of opposite sides of the display module DM.

The housing HS may have a hexahedral shape, but the shape of the housing HS according to the invention is not limited thereto. The housing HS may extend longer in a second direction DR2 than a first direction DR1 crossing the second direction DR2. Hereinafter, a direction substantially perpendicularly crossing a plane defined by the first and second directions DR1 and DR2 is defined as a third direction DR3.

An opening OP may be defined at one side of opposite sides of the housing HS, which are opposite to each other in the first direction DR1. The opening OP may be adjacent to an upper portion of the housing HS rather than a lower portion of the housing HS.

The display module DM may be wound around a roller disposed in the housing HS. Hereinafter, the above-described structure will be described in detail. The display module DM may be inserted and withdrawn from the housing HS through the opening OP.

The handle HND may be disposed outside the housing HS so as to be adjacent to the opening OP. The handle HND may be adjacent to the upper portion of the housing HS. The handle HND may move in the first direction DR1. When the handle HND moves in the first direction DR1 to move away from the housing HS, the display module DM may be withdrawn to the outside of the housing HS through the opening OP. The handle HND may be manipulated by a user.

The support SUP may be disposed at opposite sides of the display module DM, which are opposite to each other in the second direction DR2, to support the display module DM. Hereinafter, e above-described structure will be described in detail. The support SUP may include a first support SUP1 adjacent to one side of the display module DM extending in the first direction DR1 and a second support SUP2 adjacent to the other side of the display module DM extending in the first direction DR1. One side and the other side of the display module DM may be opposite sides of the display module DM, which are opposite to each other in the second direction DR2.

Figure 3:
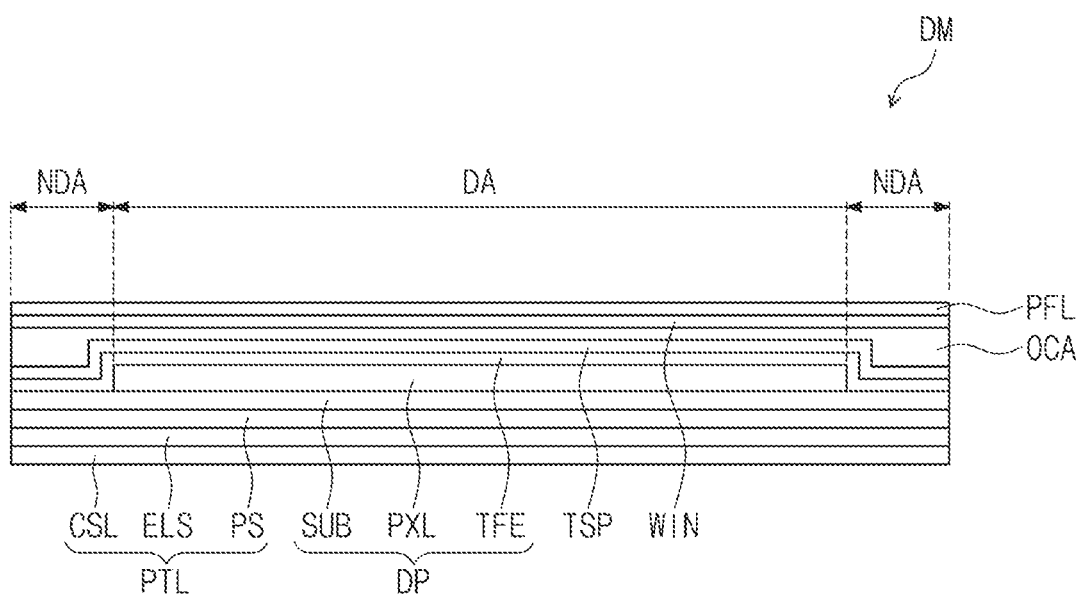
FIG. 3 is a schematic cross-sectional view of the display module illustrated in FIG. 2.

FIG. 3 is a schematic cross-sectional view of the display module illustrated in FIG. 2.

Referring to FIG. 3, the display module DM may include a display panel DP, an input sensing part TSP disposed on the display panel DP, a window WIN disposed on the input sensing part TSP, a protective film PFL disposed on the window WIN, an adhesive OCA disposed between the input sensing part TSP and the window WIN, and a protective layer PTL disposed under the display panel DP.

The display panel DP according to an embodiment of the present invention may be an emission type display panel, but the type of the display panel DP according to the invention is not limited thereto. For example, the display panel DP may be an organic light emitting display panel or a quantum dot light emitting display panel. The organic light emitting display panel may include an organic light emitting material. An emission layer of the quantum dot light emitting display panel may include a quantum dot, a quantum rod, and the like. Hereinafter, the display panel DP will be described as the organic light emitting display panel.

The display panel DP may include a substrate SUB, a pixel layer PXL disposed on the substrate SUB, and a thin film encapsulation layer TFE disposed on the substrate SUB to cover the pixel layer PXL. The substrate SUB may be a transparent substrate and include a flexible plastic substrate. For example, the substrate SUB may include polyimide ("PI").

The substrate SUB may include a display area DA and a non-display area NDA around the display area DA. The pixel layer PXL may be disposed on the display area DA. The pixel layer PXL may include a plurality of pixels, and each of the pixels may include a light emitting element.

The thin film encapsulation layer TEF may include at least two inorganic layers and an organic layer disposed between the at least two inorganic layers. The inorganic layers may include an inorganic material and protect the pixel layer PXL against moisture/oxygen. The organic layer may include an organic material and protect the pixel layer PXL against foreign substances such as dust particles.

The input sensing part TSP may sense an external input (e.g., a user's touch) to change the external input into a predetermined input signal, thereby providing the input signal to the display panel DP. The input sensing part TSP may include a plurality of touch sensing parts (not shown) for sensing the external input. The touch sensing parts may sense the external input in a capacitive manner. The display panel DP may receive an input signal from the input sensing part TSP and generate an image corresponding to the input signal.

The window WIN may protect the display panel DP and the input sensing part TSP against external scratches and impact. The window WIN may be attached to the input sensing part TSP by using the adhesive OCA. The adhesive OCA may include an optical clear adhesive. An image generated in the display panel DP may pass through the window WIN and then be provided to the user.

The protective film PFL may protect the window WIN, the display panel DP, and the input sensing part TSP from the external scratches and impact. The protective film PFL may include a hard coating layer and a soft coating layer.

The protective layer PTL may include a protective substrate PS disposed under the display panel DP, an elastic layer ELS disposed under the protective substrate PS, and a cushion layer CSL disposed under the elastic layer ELS. The protective substrate PS may protect a lower portion of the display panel DP. The protective substrate PS may include a flexible plastic substrate. For example, the protective substrate PS may include polyethylene terephthalate ("PET").

The elastic layer ELS may include an elastomer. The elastic layer ELS may provide restoring force to the display module DM when the display module DM is bent. The cushion layer CUL may absorb an external impact applied to a lower portion of the display module DM to protect the display panel DP. The cushion layer CUL may include a foam sheet having predetermined elastic force.

Figure 4:
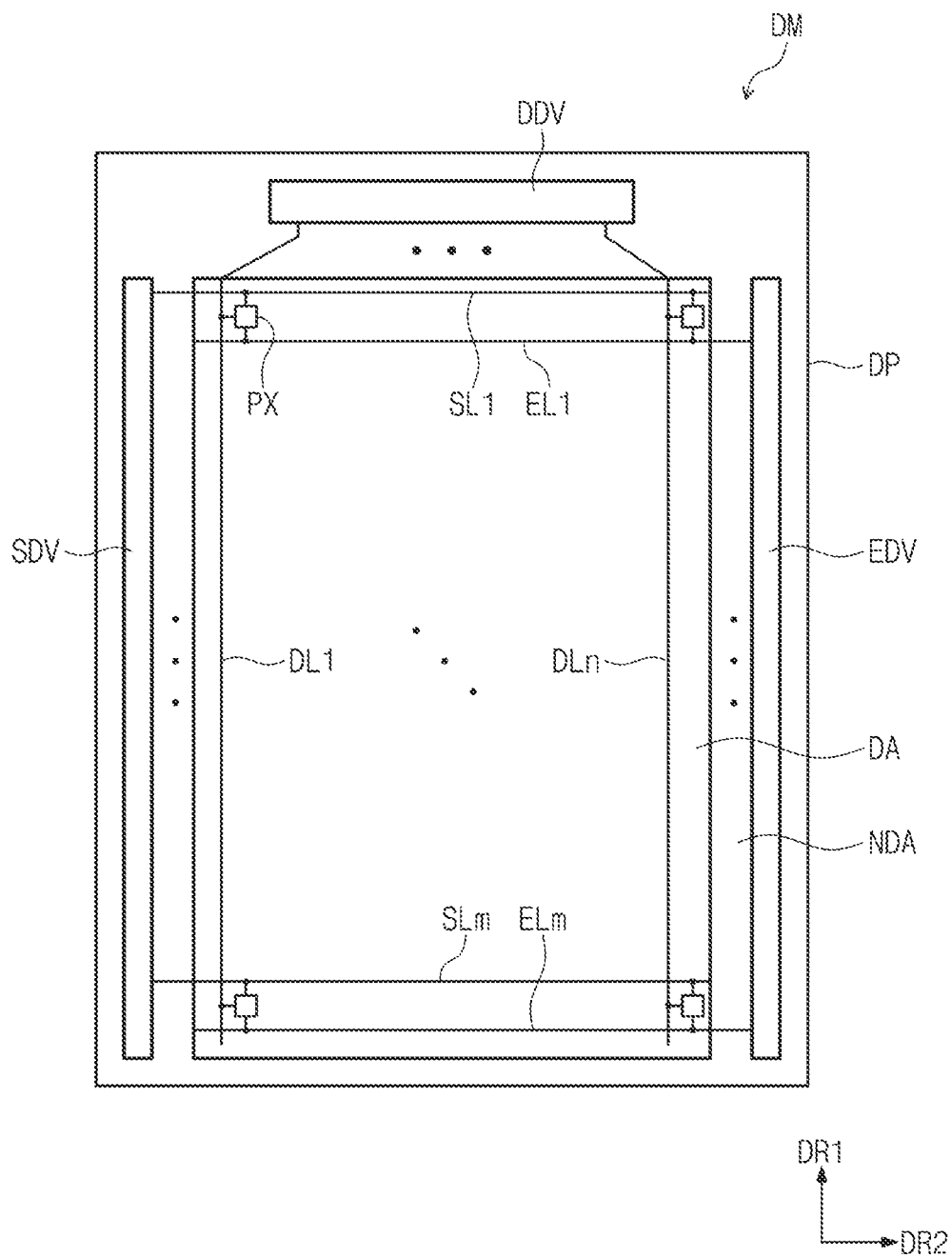
FIG. 4 is a plan view of the display module illustrated in FIG. 3.

FIG. 4 is a plan view of the display module illustrated in FIG. 3.

Referring to FIG. 4, the display module DM according to an embodiment of the present invention may include a display panel DP, a scan driver SDV, a data driver DDV, and an emission driver EDV. Although a planar shape of the display panel DP is exemplified in FIG. 4, a planar shape of the input sensing part TSP is omitted.

The display panel DP may be a flexible display panel. For example, the display panel DP may include a plurality of electronic elements disposed on a flexible substrate. The display panel DP may have a rectangular shape having long sides in the first direction DR1 and short sides in the second direction DR2. The display panel DP may include a display area DA and a non-display area NDA surrounding the display area DA.

The display panel DP may include a plurality of pixels PX, a plurality of scan lines SL1 to SLm, a plurality of data lines DL1 to DLn, and a plurality of emission lines EL1 to ELm. Here, m and n are natural numbers. The pixels PX may be arranged in a matrix form, but the arranged form of the pixel PX according to the invention is not limited thereto and thus may be arranged in various forms. The pixels PX may be disposed on the display area DA and connected to the scan lines SL1 to SLm, the data lines DL1 to DLn, and the emission lines EL1 to ELm.

The scan driver SDV, the data driver DDV, and the emission driver EDV may be disposed on the non-display area NDA. The scan driver SDV and the emission driver EDV may be disposed adjacent to the long sides of the display panel DP, respectively. The data driver DDV may be manufactured in the form of an integrated circuit chip and disposed adjacent to one short side of the display panel DP.

The scan lines SL1 to SLm may extend in the second direction DR2 and be connected to the scan driver SDV. The data lines DL1 to DLn may extend in the first direction DR1 and be connected to the data driver DDV. The emission lines EL1 to ELm may extend in the second direction DR2 and be connected to the emission driver EDV.

The scan driver SDV may generate a plurality of scan signals, and the scan signals may be applied to the pixels PX through the scan lines SL1 to SLm. The scan signals may be sequentially applied to the pixel PX. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

Although not shown, the display module DM may include a timing controller (not shown) that controls operations of the scan driver SDV, the data driver DDV, and the emission driver EDV.

The timing controller may generate a scan control signal a data control signal, and an emission control signal in response to control signals received from the outside. The timing controller may receive image signals from the outside and convert a data format of the image signals to match an interface specification with the data driver DDV and thus provide the converted data format to the data driver DDV.

The scan driver SDV may generate scan signals in response to the scan control signal, and the emission driver EDV may generate emission signals in response to the emission control signal. The data driver may receive image signals, in which the data format is converted, and generate data voltages corresponding to the image signals in response to the data control signal.

The pixels PX may receive the data voltages in response to the scan signals. The pixels PX may emit light having luminance corresponding the data voltages in response to the emission signals to display an image. An emission time of the pixels PX may be controlled by the emission signals.

Figure 5:
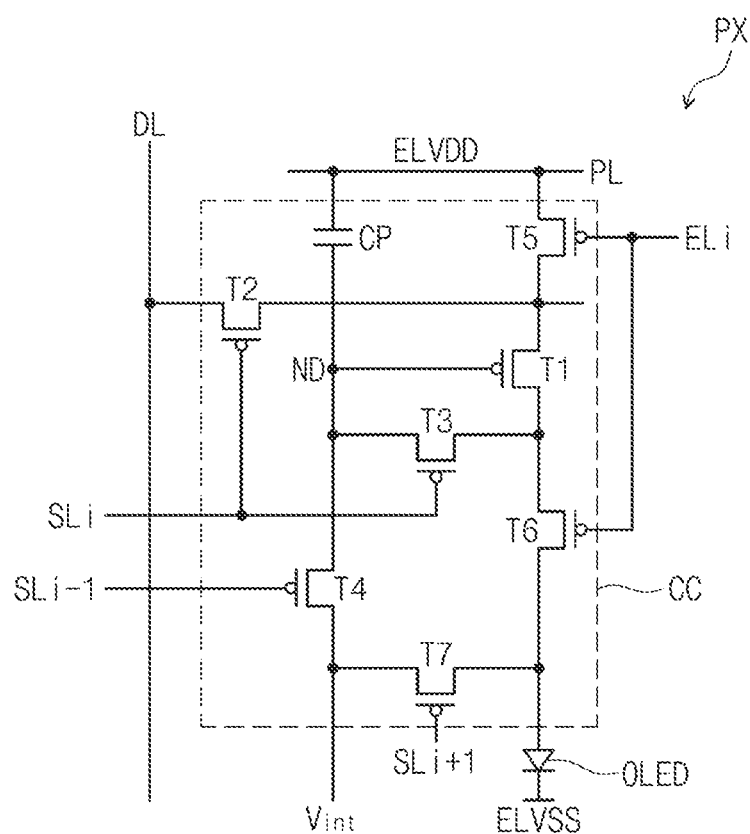
FIG. 5 is a view illustrating an example of an equivalent circuit of any one pixel illustrated in FIG. 4.

FIG. 5 is a view illustrating an example of an equivalent circuit of any one pixel illustrated in FIG. 4.

Referring to FIG. 5, the pixel PX may include a light emitting element OLED and a pixel circuit CC. The pixel circuit CC may include a plurality of transistors T1 to T7 and a capacitor CP. The pixel circuit CC may control an amount of current flowing to the light emitting element OLED to correspond to a data voltage.

The light emitting element OLED may emit light having predetermined luminance corresponding to an amount of current supplied from the pixel circuit CC. For this, a first voltage ELVDD may be set to a level greater than a level of the second voltage ELVSS.

Each of the transistors T1 to T7 may include an input electrode (or a source electrode), an output electrode (or a drain electrode), and a control electrode (or a gate electrode). In this specification, for convenience, either the input electrode or the output electrode may be referred to as a first electrode and the other may be referred to as a second electrode.

The first electrode of the first transistor T1 may receive the first voltage ELVDD via the fifth transistor T5, and the second electrode may be connected to an anode electrode the light emitting element OLED via the sixth transistor T6. The first transistor T1 may be defined as a driving transistor. The first transistor T1 may control an amount of current flowing to the light emitting element OLED according to the voltage applied to the control electrode of the first transistor T1.

The second transistor T2 may be connected between the data line DL and the first electrode of the first transistor T1, and the control electrode of the second transistor T2 may be connected to an i-th scan line SLi. The second transistor T2 may receive an i-th scan signal Si through the i-th scan line SLi to turn on so that the data line DL and the first electrode of the first transistor T1 are electrically connected to each other.

The third transistor T3 may be connected between the second electrode and the control electrode of the first transistor T1. The control electrode of the third transistor T3 may be connected to the i-th scan line SLi. The third transistor T3 may receive the i-th scan signal Si through the i-th scan line SLi to turn on so that the second electrode and the control electrode of the first transistor T1 are electrically connected to each other. when the third transistor T3 is turned on, the first transistor T1 may be connected in the form of a diode.

The fourth transistor T4 is connected between a node ND and an initialization power generation part (not shown). The control electrode of the fourth transistor T4 may be connected to an (i−1)-th scan line SLi−1. The fourth transistor T4 may receive an (i−1)-th scan signal through an (i−1)-th scan line SLi−1 to turn on so that an initial voltage Vint is applied to the node ND.

The fifth transistor T5 may be connected between the power line PL and the first electrode of the first transistor T1. The control electrode of the fifth transistor T5 may be connected to an i-th emission line ELi.

The sixth transistor T6 may be connected between the second electrode of the first transistor T1 and the anode electrode of the light emitting element OLED. The control electrode of the sixth transistor T6 may be connected to the i-th emission line Eli.

The seventh transistor T7 may be connected between the initialization power generation part (not shown) and the anode electrode of the light emitting element OLED. the control electrode of the seventh transistor T7 is connected to an (i+1)-th scan line SLi+1. The seventh transistor T7 may receive an (i+1)-th scan signal through an (i+1)-th scan line SLi+1 to turn on so that the initial voltage Vint is applied to the anode electrode of the light emitting element OLED.

The capacitor CP may be disposed between the power line PL and the node ND. The capacitor CP may store the data voltage. When the fifth transistor T5 and the sixth transistor T6 are turned on, an amount of current flowing through the first transistor T1 may be determined according to the voltage stored in the capacitor CP.

In FIG. 5, the transistors T1 to T7 are illustrated as a PMOS, but the present invention is not limited thereto. In another embodiment of the present invention, the transistors T1 to T7 may be provided as an NMOS.

Figure 6:
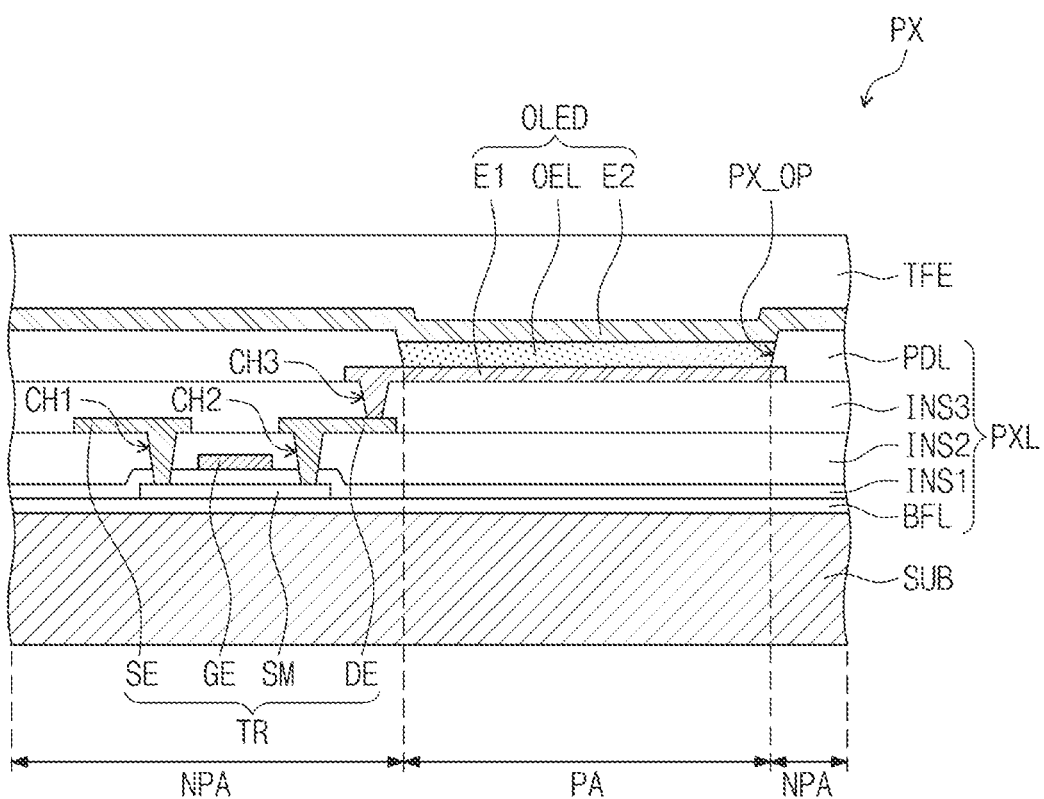
FIG. 6 is a cross-sectional view of a portion corresponding to a light emitting element illustrated in FIG. 5.

FIG. 6 is a cross-sectional view of a portion corresponding to a light emitting element illustrated in FIG. 5.

Referring to FIG. 6, the pixel PX may include the light emitting element OLED and the transistor TR connected to the light emitting element OLED. The light emitting element OLED may include a first electrode E1, a second electrode E2, and an organic emission layer OEL disposed between the first electrode E1 and the second electrode E2. The transistor TR may be the sixth transistor T6 of FIG. 5. The light emitting element OLED may include an organic light emitting element.

The first electrode E1 may be an anode electrode, and the second electrode E2 may be a cathode electrode. The first electrode E1 may be defined as a pixel electrode, and the second electrode E2 may be defined as a common electrode.

The pixel PX may be divided into a pixel area PA and a non-pixel area NPA around the pixel area PA. The light emitting element OLED may be disposed on the pixel area PA, and the transistor TR may be disposed on the non-pixel area NPA.

The transistor TR and the light emitting element OLED may be disposed on the substrate SUB. A buffer layer BFL may be disposed on the substrate SUB, and the buffer layer may include an inorganic material.

The semiconductor layer SM of the transistor TR may be disposed on the buffer layer BFL. The semiconductor layer SM may include a semiconductor made of an inorganic material such as amorphous silicon or polycrystalline silicon, or an organic semiconductor. Also, the semiconductor layer SM may include an oxide semiconductor. Although not shown in FIG. 6, the semiconductor layer SM may include a source region, a drain region, and a channel region between the source region and the drain region.

A first insulation layer INS1 may be disposed on the buffer layer BFL to cover the semiconductor layer SM. The first insulation layer INS1 may include an inorganic material. A gate electrode GE of the transistor TR overlapping the semiconductor layer SM in a plan view may be disposed on the first insulation layer INS1. The gate electrode GE may be disposed to overlap a channel region of the semiconductor layer SM in a plan view.

A second insulation layer INS2 may be disposed on the first insulation layer INS1 to cover the gate electrode GE. The second insulation layer INS2 may include an organic material and/or an inorganic material.

The source electrode SE and the drain electrode DE of the transistor TR may be disposed to be spaced apart from each other on the second insulation layer INS2. The source electrode SE may be connected to the source region of the semiconductor layer SM through a first contact hole CH1 that is defined in each of the first and second insulation layers INS1 and INS2. The drain electrode DE may be connected to the drain region of the semiconductor layer SM through a second contact hole CH2 that is defined in each of the first and second insulation layers INS1 and INS2.

A third insulation layer INS3 may be disposed on the second insulation layer INS2 to cover the source and drain electrodes SE and DE of the transistor TR. The third insulation layer INS3 may be a planarization layer that provides a flat top surface and include an organic material.

The first electrode E1 may be disposed on the third insulation layer INS3. The first electrode E1 may be connected to the drain electrode DE of the transistor TR through a third contact hole H3 that is defined in the third insulation layer INS3.

A pixel defining layer PDL through which a predetermined area of the first electrode E1 is exposed may be disposed on the first electrode E1 and the third insulation layer INS3. An opening PX_OP through which a predetermined portion of the first electrode E1 is exposed may be defined in the pixel defining layer PDL.

An organic emission layer OEL may be disposed on the first electrode E1 within the opening PX_OP. The organic emission layer OEL may emit one of red light, green light, and blue light. However, the embodiment of the present invention is not limited thereto. For example, the organic emission layer OEL may generate white light by combination of organic materials that respectively generate red, green, and blue light.

The second electrode may be disposed on the pixel defining layer PDL and the organic light emitting layer OEL. The thin film encapsulation layer TFE may be disposed on the light emitting element OLED to cover the pixel PX. A layer between the substrate SUB and the thin film encapsulation layer TEE may be defined as the pixel layer PXL.

The first voltage ELVDD may be applied to the first electrode E1, and the second voltage ELVSS may be applied to the second electrode E2. Holes and electrons injected into the organic emission layer OEL may be coupled to each other to form exciton. While the exciton may be transitioned to a ground state, the organic light emitting element OLED may emit light. The light emitting element OLED may emit red, green, or blue light according to a flow of current to display an image.

Figure 7:
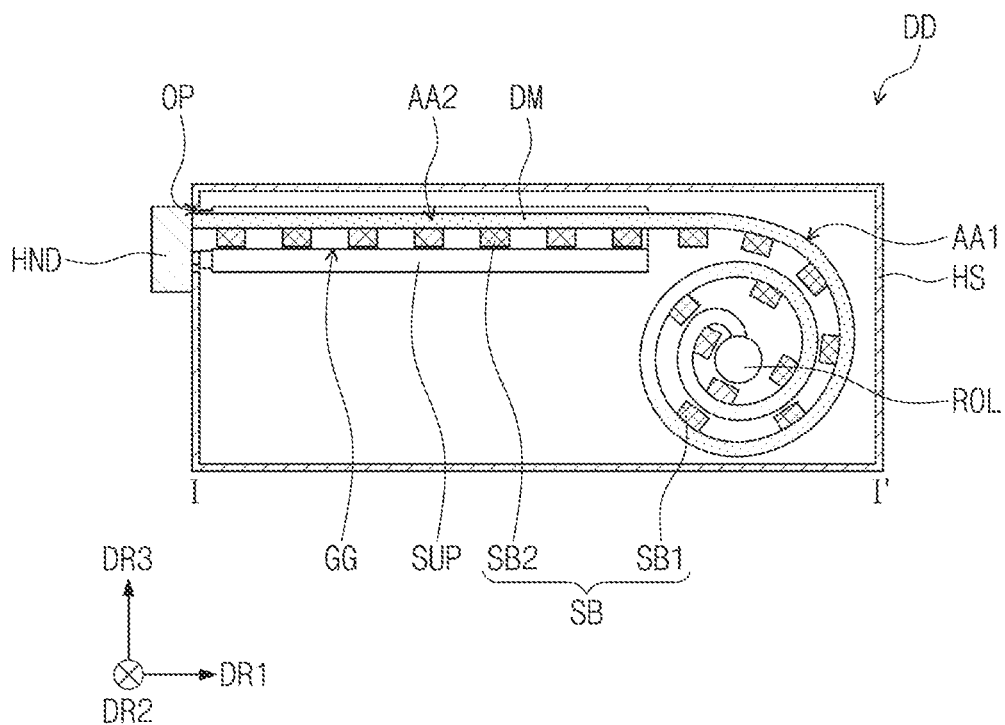
FIG. 7 is a cross-sectional view taken along line I-I' of FIG. 1.
Figure 8:
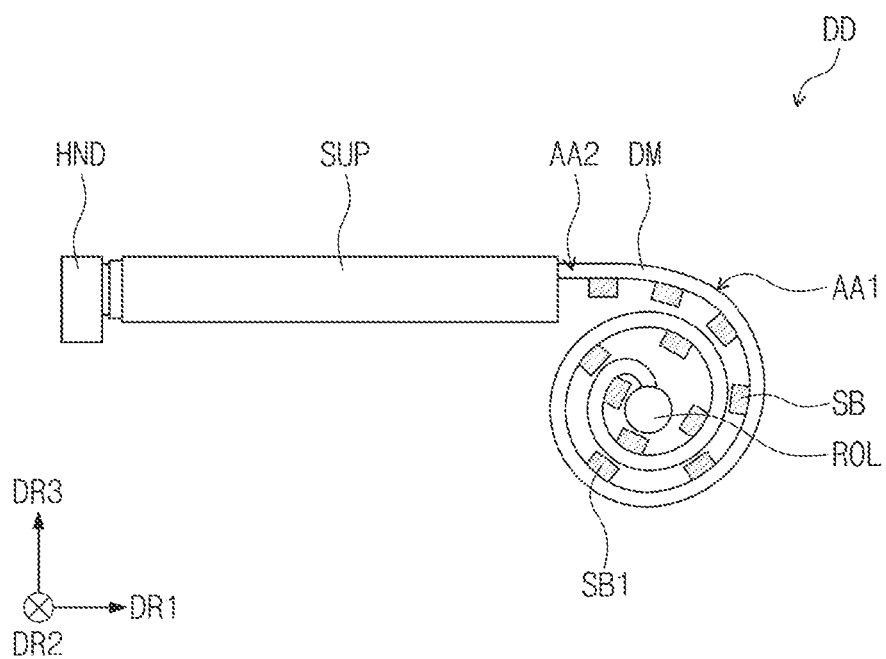
FIG. 8 is a side view illustrating the inside of the housing when the inside of the housing illustrated in FIG. 1 is viewed in a second direction.

FIG. 7 is a cross-sectional view taken along line I-I' of FIG. 1. FIG. 8 is a side view illustrating the inside of the housing when the inside of the housing illustrated in FIG. 1 is viewed in the second direction.

For convenience of description, the housing HS is omitted in FIG. 8.

Referring to FIGS. 7 and 8, the display device DD includes a housing HS, a display module DM, a roller ROL, a plurality of support bars SB, a support SUP, and a handle HND. The display module DM, the roller ROL, the plurality of support bars SB, and the support SUP may be accommodated in the housing HS.

The roller ROL may be disposed in the housing HS and may be adjacent to one side of the housing HS, which is opposite to the other side of the housing HS in which the opening OP is defined. When viewed in the second direction DR2, the roller ROL may have a circular shape. For example, the roller ROL may have a cylindrical shape extending in the second direction DR2. The roller ROL may rotate in clockwise and counterclockwise directions.

The display module DM may extend in the first direction DR1 and then be wound around the roller ROL. One end of the display module DM may be connected to the roller ROL, and a portion of the display module DM near the one end may be wound around the roller ROL. The other end of the display module DM, which is an end opposite to the one end of the display module DM connected to the roller ROL, may be connected to the handle HND. The other end of the display module DM may be adjacent to the opening OP.

The display module DM may include a first area AA1 connected to the roller ROL and wound around the roller ROL and a second area AA2 that is not wound around the roller ROL. The second area AA2 may be maintained in a flat state and connected to the handle HND.

A front surface of the display module DM may be defined as a surface for displaying an image. The support bars SB may be disposed on a rear surface of the display module DM, which is opposite to the front surface of the display module DM. The support bars SB may be connected to the rear surface of the display module DM. For example, the support bars SB may be attached to the rear surface of the display module DM using a pressure-sensitive adhesive. The support bars SB may support the display module DM.

When viewed in the second direction DR2, each of the support bars SB may have a rectangular shape, but the shape of the support bar SB according to the invention is not limited thereto. The support bars SB may be arranged to be spaced apart from each other in the first direction DR1 in the second area AA2. Each of the support bars SB may be provided in a rigid type. For example, the support bars SB may include a metal. The support bars SB may be inserted and withdrawn from the housing ITS through the opening OP.

The support bars SB may include a plurality of first support bars SB1 disposed on a bottom surface of the first area AA1 and a plurality of second support bars SB2 disposed on a bottom surface of the second area AA2. The first support bars SB1 may be wound around the roller ROL with the first area AA1. The second support bars SB2 may be disposed on the support SUP. One end of the support SUP may be connected to the handle HND.

Gaps between the support bars SB may vary according to the areas of the display module DM where the support bars SB are disposed. A more detailed arrangement structure of the support bars SB will be described in detail below with reference to FIG. 13.

Lower portions of the first support bars SB1 wound around the roller ROL may be in contact with the top surface of the first area AA1 wound around the roller ROL. As described above, the protective film PFL of the display module DM may protect the display module DM from the first support bars SB1.

A guide groove GG may be defined in the support SUP. The guide groove GG may be extended in the first direction DR1 (See FIG. 12). The second support bars SB2 may be disposed in the guide groove GG to move in the first direction DR1 along the guide groove GG. The second support bars SB2 may be disposed in the guide groove GG and supported by the support SUP, and the second support bars SB2 may support the display module DM. That is, substantially, the support SUP may serve to support the display module DM.

The display module DM and the support bars SB may be withdrawn to the outside of the housing HS through the opening OP and the support SUP may extend in the first direction DR1 like an antenna. Hereinafter, the above-described structure will be described in detail.

Figure 9:
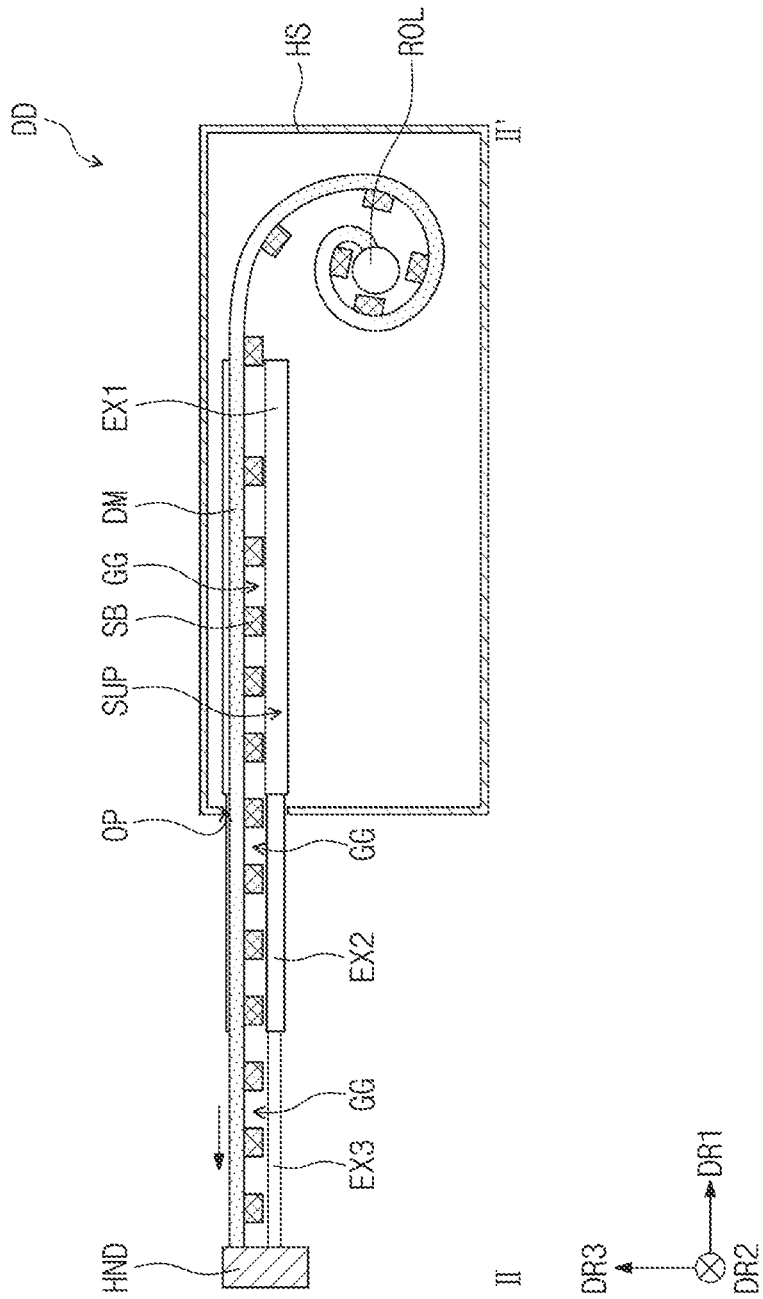
FIG. 9 is a cross-sectional view taken along line II-II' illustrated in FIG. 2.
Figure 10:
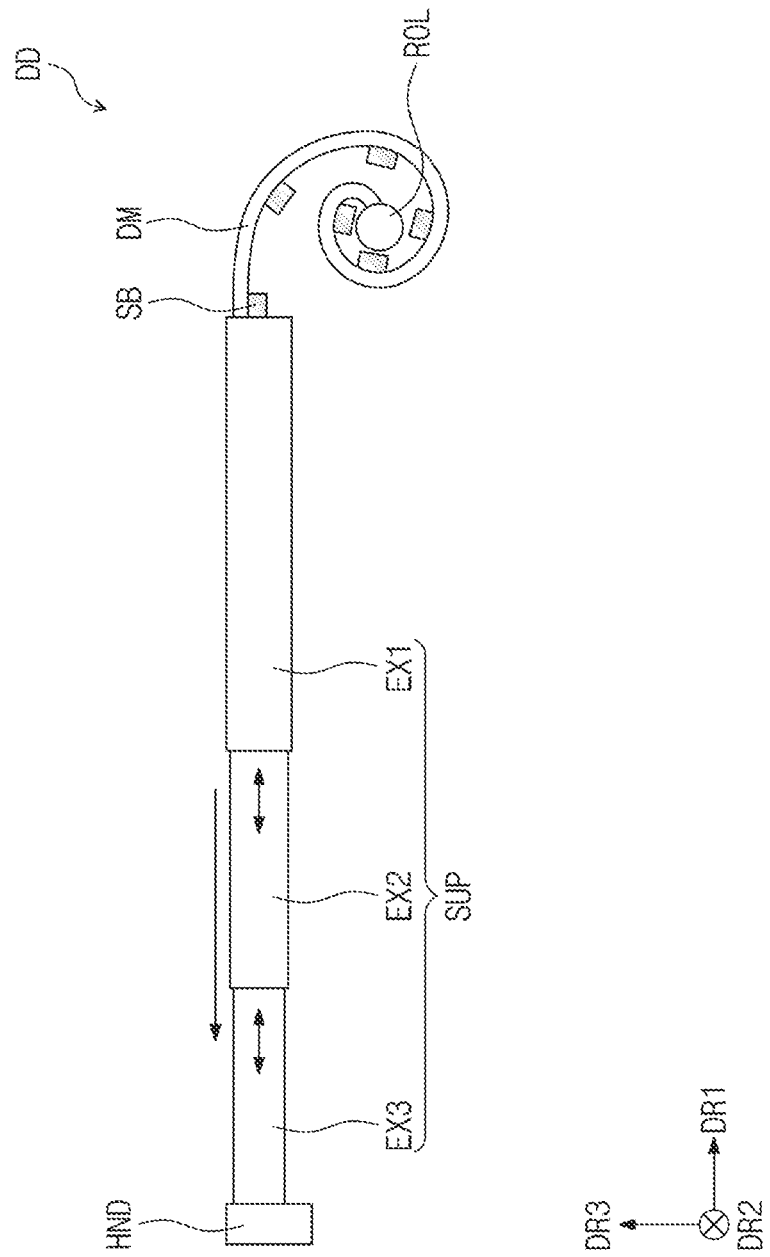
FIG. 10 is a side view illustrating the inside of the housing when the inside of the housing illustrated in FIG. 2 is viewed in a second direction.

FIG. 9 is a cross-sectional view taken along line II-II' illustrated in FIG. 2. FIG. 10 is a side view illustrating the inside of the housing when the inside of the housing illustrated in FIG. 2 is viewed in the second direction.

For convenience of description, the housing HS is omitted in FIG. 10.

Referring to FIGS. 9 and 10, the handle HND may move in the first direction DR1 away from the housing HS. As the handle HND moves, the display module DM connected to the handle HND may move in the first direction DR1.

The display module DM may be unwound from the roller ROL, and the unwound display module DM may be withdrawn to the outside of the housing HS through the opening OP. The support bars SB wound around the roller ROL may also be unwound from the roller ROL to move to the outside of the housing HS according to the movement of the display module DM. An operation in which the display module DM is exposed to the outside of the housing HS may be defined as an open mode. In the open mode, an exposed portion of the display module DM may be expanded.

As the handle HND moves, the support SUP connected to the handle HND may extend to the outside of the housing HS through the opening OP. The support SUP may extend to the outside of the housing HS to support the display module DM at the outside of the housing HS. For example, the support bars SB moving to the outside of the housing HS may be supported by the support SUP, and the support bars SB supported by the support SUP may support the display module DM.

The support SUP may include a first extension part EX1, a second extension part EX2, and a third extension part EX3 to extend to the outside of the housing HS. The second extension part EX2 may be disposed between the first extension part EX1 and the third extension part EX3.

In order to have the same structure that is capable of being extended like the antenna, the second extension part EX2 may be inserted into and withdrawn from the first extension part EX1, and the third extension part EX3 may be inserted into and withdrawn from the second extension part EX2. The first extension part EX1 may be disposed in the housing HS, and the second and third extension parts EX2 and EX3 may move to the outside of the housing HS. The third extension part EX3 may be connected to the handle HND.

A guide groove GG may be defined in each of the first, second, and third extension parts EX1, EX2, and EX3. The guide grooves GG defined in the first, second, and third extension parts EX1, EX2, and EX3 may be continuous spaces overlapping each other in the first direction DR1. The support bars SB may be disposed in the guide grooves GG.

When the handle HND moves in the first direction DR1 to be closer to the housing HS, as illustrated in FIGS. 7 and 8, the handle HND may be disposed adjacent to the opening OP outside the housing HS. As the handle HND moves to be closer to the housing HS, the support SUP may be reduced in the first direction DR1 so as to be disposed in the housing HS, and the display module DM may be inserted into the housing HS. This operation may be defined as a closed mode.

In the closed mode, the first area AA1 and the first support bars SB1 may be wound around the roller ROL as illustrated in FIGS. 7 and 8.

Figure 11:
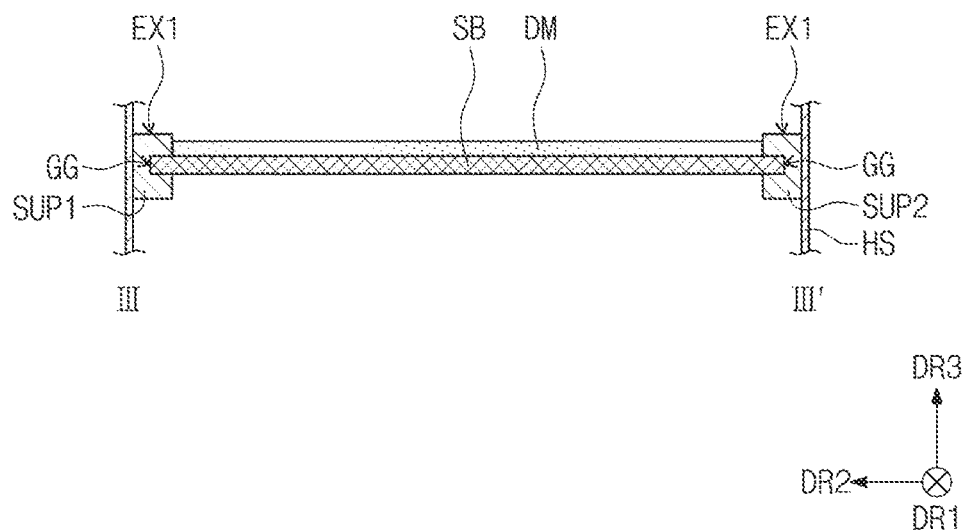
FIG. 11 is a cross-sectional view taken along line III-III' of FIG. 2.
Figure 12:
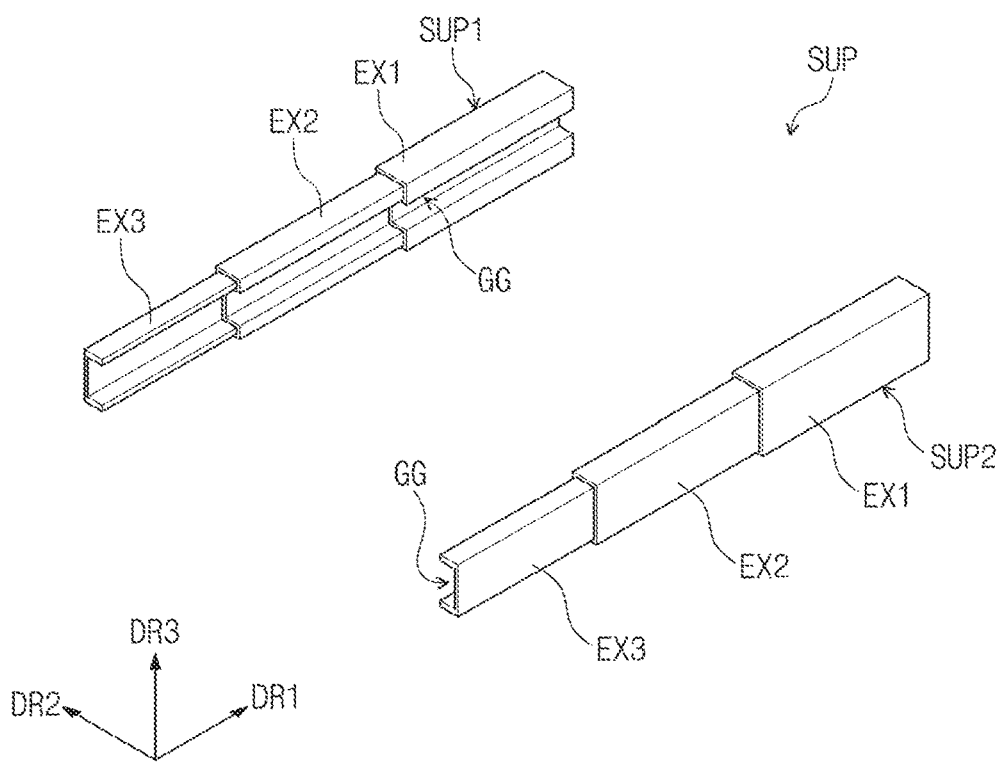
FIG. 12 is a perspective view of a support illustrated in FIG. 10.

FIG. 11 is a cross-sectional view taken along line III-III' of FIG. 2. FIG. 12 is a perspective view of the support illustrated in FIG. 10.

Substantially, FIG. 11 is a view for explaining a structure of the support bar SB disposed on the first and second supports SUP1 and SUP2. Therefore, for convenience of description, FIG. 11 illustrates portions of the support bar SB disposed on the first and second supports SUP1 and SUP2, the display module DM disposed on the support bar SB, and parts of the housing HS adjacent to the first and second supports SUP1 and SUP2, and other constituents are omitted.

Referring to FIGS. 11 and 12, the support SUP may include the first support SUP1 and the second support SUP2, which extend in the first direction DR1 and are spaced apart from each other in the second direction DR2.

The first support SUP1 and the second support SUP2 may support one side and the other side (hereinafter, referred to as opposite sides of the support bar SB) of the support bar SB, which are opposite to each other in the second direction DR2, respectively. For example, both the opposite sides of the support bar SB may be inserted into the guide grooves GG defined on an inner surface of the first support SUP1 and an inner surface of the second support SUP2, which face each other and then be disposed in the guide grooves GG, respectively. The support bar SB may move in the first direction DR1 along the guide grooves GG defined in the first and second supports SUP1 and SUP2.

Each of the first support SUP1 and the second support SUP2 may include a first extension part EX1, a second extension part EX2, and a third extension part EX3 in which the guide grooves GG are defined. Since configurations of the first extension part EX1, the second extension part EX2, and the third extension part EX3 have been described in detail above, descriptions thereof will be omitted.

One end of the first support SUP1 and one end of the second support SUP2, which are defined as first ends of the support SUP, may be connected to the handle HND. Specifically, the third extension parts EX3 of the first and second supports SUP1 and SUP2 may be connected to the handle HND.

The first extension parts EX1 may be connected to the housing HS. For example, the first extension parts EX1 may be connected and fixed to inner surfaces of the housing HS, which face each other in the second direction DR2. In the open mode, the first extension parts EX1 may be disposed in the housing HS, and the second and third extension parts EX2 and EX3 may move to the outside of the housing HS. Thus, the first and second supports SUP1 and SUP2 may extend to the outside of the housing HS in the open mode.

The display module DM may be disposed on the support bar SB and may be disposed between the first support SUP1 and the second support SUP2.

Figure 13:
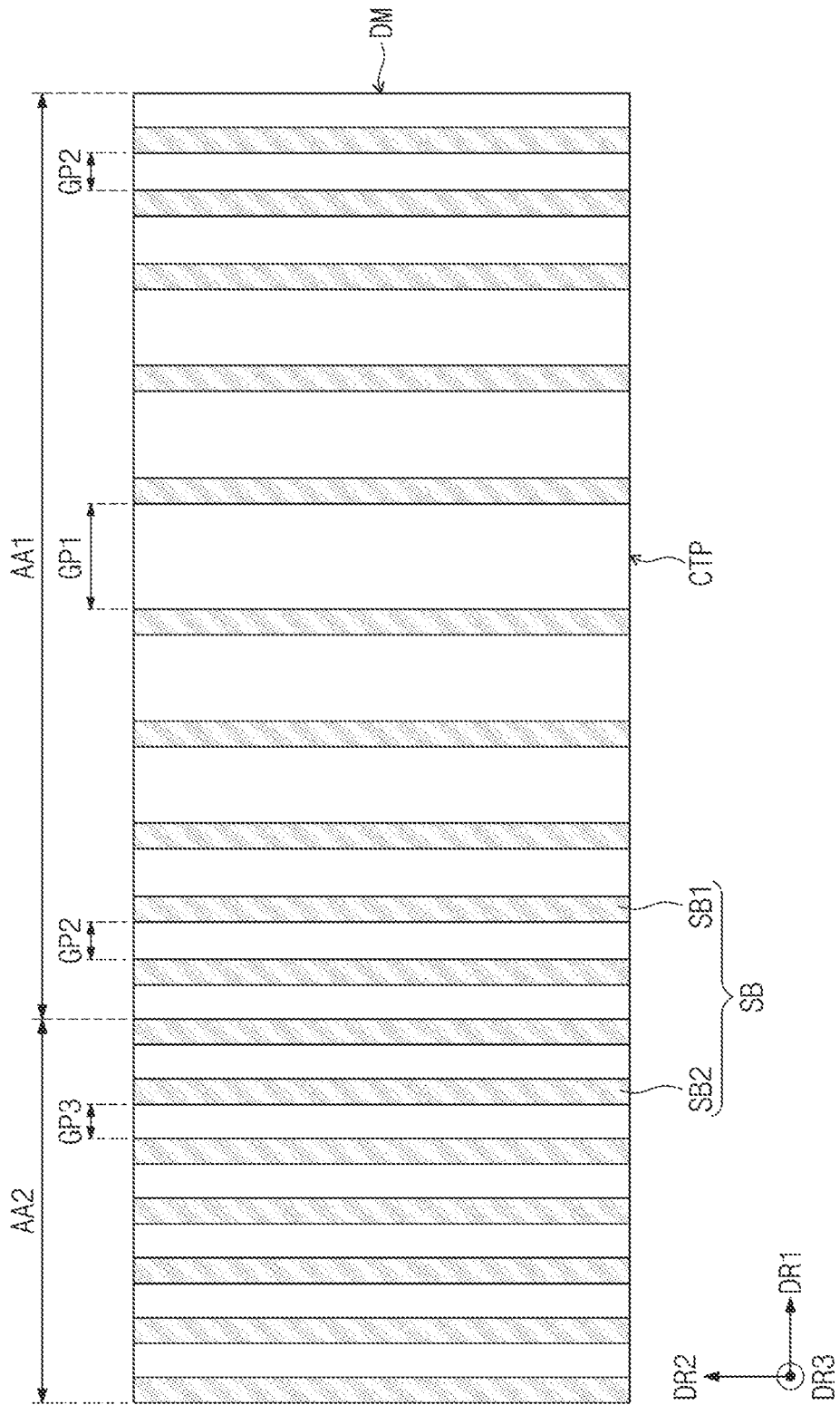
FIG. 13 is a view of support bars disposed on the display module when the display module illustrated in FIG. 7 is unfolded.

FIG. 13 is a view of support bars disposed on the display module when the display module illustrated in FIG. 7 is unfolded.

Practically, FIG. 13 may be a plan view of the support bars.

Referring to FIG. 13, the first and second support bars SB1 and SB2 may extend in the second direction DR2 and may be arranged to be spaced apart from each other in the first direction DR1.

Hereinafter, a width of each of the support bars SB is defined as a length measured in the first direction DR1, and a thickness of the support bars SB is defined as a length measured in the third direction DR1 (in other words, thickness direction). In addition, gaps between the support bars SB are defined as lengths measured in the first direction DR1. Each of the gaps between the support bars SB may be defined as a gap between two adjacent support bars SB.

A gap between the support bars SB may vary according to the areas of the display module DM. For example, in the first area AA1, gaps between the first support bars SB1 may vary, and in the second area AA2, gaps between the second support bars SB2 may be uniform.

A first gap GP1 between the first support bars SB1 disposed at a central portion CTP of the first area AA1 among the first support bars SB1 may be greater than a second gap GP2 between the first support bars SB1 disposed at portions adjacent to opposite sides of the first area AA1 among the first support bars SB1. Both the opposite sides of the first area AA1 may be one side and the other side of the first area AA1, which are opposite to each other in the first direction DR1.

The gaps between the first support bars SB1 may gradually increase from both the opposite sides of the first area AA1 toward the central portion CTP of the first area AA1. The gaps between the first support bars SB1 may vary to be symmetrical to each other with respect to the central portion CTP of the first area AA1.

The first support bars SB1 may have the same width in the first direction DR1. Also, the first support bars SB1 may have the same thickness in the third direction DR3 as illustrated in FIG. 9.

The second support bars SB2 may be equally spaced apart from each other in the first direction DR1. Each of the second support bars SB2 may have the same width and the same thickness as each of the first support bars SB1.

Each of the gaps between the first support bars SB1 may be greater than each of the gaps between the second support bars SB2. For example, each of the third gaps GP3 between the second support bars SB2 may be less than the smallest second gap GP2 among the gaps between the first support bars SB1.

Stress may be generated in the display module DM wound around the roller ROL. For example, when the first area AA1 to which the support bars SB are attached is wound around the roller ROL, stress may be generated in the first area AA1 that is bent. The larger stress may be generated by the support bars SB attached to the first area AA1 and may increase toward the central portion of the first area AA1.

As a surface area on which the support bars SB are disposed increases, i.e., as the number of support bars SB disposed on the first area AA1 increases, the stress caused by the support bars SB may increase. The stress may damage elements of the display module DM.

In an embodiment of the present invention, the gaps between the first support bars SB1 may gradually increase from both the opposite sides of the first area AA1 toward the central portion CTP of the first area AA1. Thus, since the surface area on which the support bars SB are disposed is reduced toward the central portion CTP, at which the larger stress is generated, the stress of the first area AA1 of the display module DM wound around the roller ROL may be reduced.

As a result, the display device DD according to an embodiment of the present invention may reduce the stress of the display module DM wound around the roller ROL.

Figure 14:
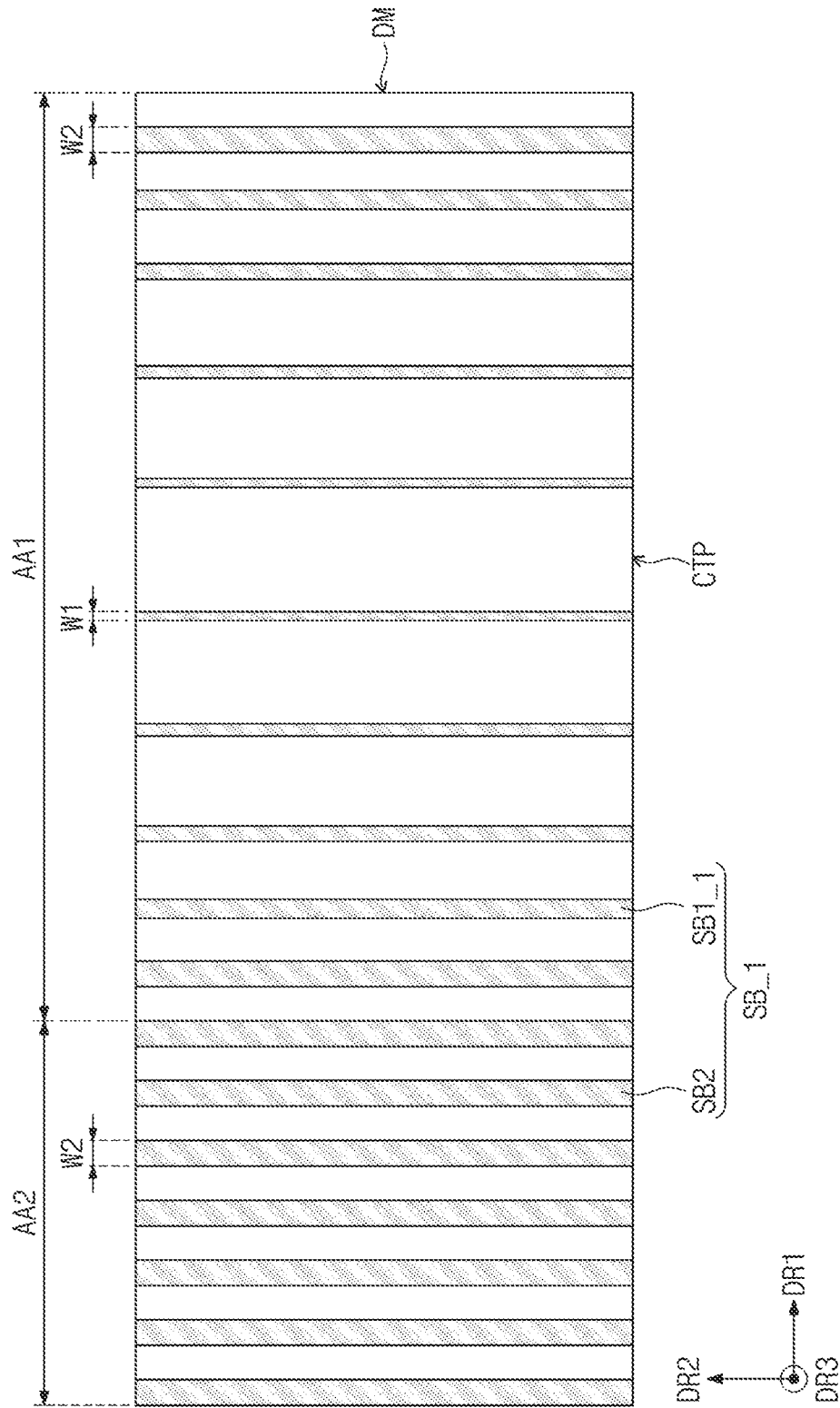
FIG. 14 is a plan view illustrating support bars of a display device according to another embodiment of the present invention.

FIG. 14 is a plan view illustrating support bars of a display device according to another embodiment of the present invention.

Hereinafter, constituents of support bars SB_1 illustrated in FIG. 14 will be mainly described with reference to constituents different from those of the support bars SB illustrated in FIG. 13, and the same constituent will be illustrated using the same reference numeral.

Referring to FIG. 14, the support bars SB_1 may include a plurality of first support bars SB1_1 disposed in a first area AA1 and a plurality of second support bars SB2 disposed in a second area AA2.

Gaps between the first support bars SB1_1 and widths of the first support bars SB1_1 may vary according to the areas of a display module DM. In the first area AA1, the gaps between the first support bars SB1_1 and the widths of the first support bars SB1_1 in the first direction DR1 may vary, and in the second area AA2, the gaps between the second support bars SB2 and the widths of the second support bars SB2 may be the same.

The gaps between the first support bars SB1_1 may gradually increase from both the opposite sides of the first area AA1 toward the central portion CTP of the first area AA1. Each of the gaps between the first support bars SB1_1 may be greater than each of the gaps between the second support bars SB2.

A width W1 of the first support bar SB1_1 disposed at a central portion CTP of the first area AA1 among the first support bars SB1_1 may be greater than a width W2 of each of the first support bars SB1_1 disposed at portions adjacent to opposite sides of the first area AA1 among the first support bars SB1_1. The widths of the first support bars SB1_1 may gradually decrease from opposite sides of the first area AA1 toward the central portion CTP of the first area AA1.

Each of the widths of the first support bars SB1_1 may be less than or equal to the width of each of the second support bars SB2. The width W2 of each of the first support bars SB1_1 disposed adjacent to both the opposite sides of the first area AA1 may be the same as the width W2 of each of the second support bars SB2. A width of each of the remaining first support bars SB1_1 may be less than the width W2 of each of the second support bars SB2. Although not shown, the thicknesses of the first support bars SB1_1 may be the same, and each of the first support bars SB1_1 may have the same thickness as each of the second support bars SB2.

Since the gaps between the first support bars SB1_1 increase, and the widths of the first support bars SB1_1 decrease toward the central portion CTP of the first area AA1 from the opposite sides of the first areas AA1, a surface area on which the first support bars SB1_1 are disposed may be reduced. Thus, the stress in the first area AA1 of the display module DM wound around the roller ROL may be effectively reduced toward the central portion CTP.

Figure 15:
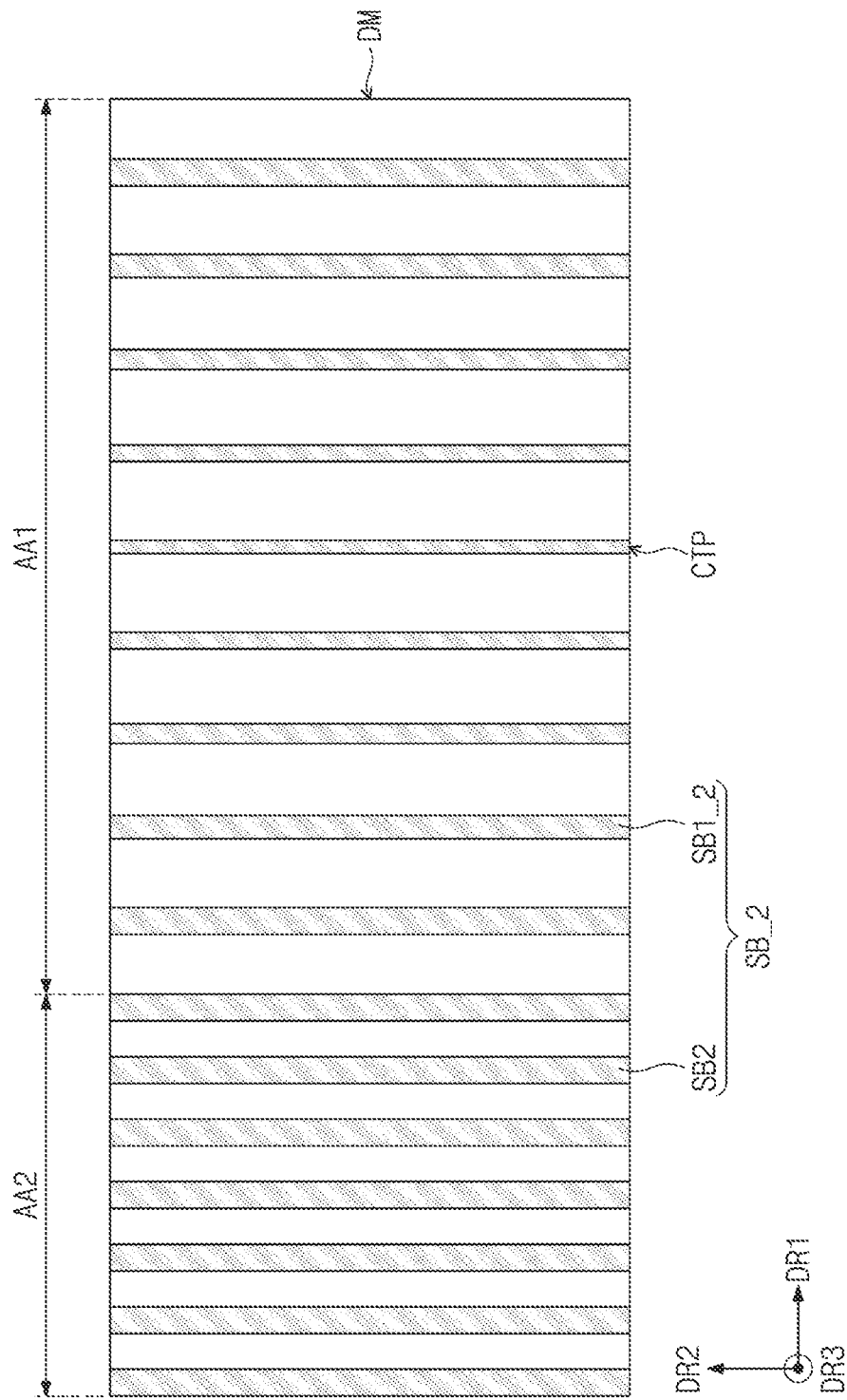
FIG. 15 is a plan view illustrating support bars of a display device according to still another embodiment of the present invention.

FIG. 15 is a plan view illustrating support bars of a display device according to still another embodiment of the present invention.

Hereinafter, constituents of support bars SB_2 illustrated in FIG. 15 will be mainly described with reference to constituents different from those of the support bars SB illustrated in FIG. 13, and the same constituent will be illustrated using the same reference numeral.

Referring to FIG. 15, the support bars SB_2 may include a plurality of first support bars SB1_2 disposed in a first area AA1 and a plurality of second support bars SB2 disposed in a second area AA2.

Each of the gaps between the first support bars SB1_2 may be greater than each of the gaps between the second support bars SB2. The first support bars SB1_2 may be spaced apart from each other at equal gaps and arranged in the first direction DR1. The widths of the first support bars SB1_2 may gradually decrease from opposite sides of the first area AA1 toward the central portion CTP of the first area AA1. Although not shown, the thicknesses of the first support bars SB1_2 may be the same, and each of the first support bars SB1_2 may have the same thickness as each of the second support bars SB2.

Since each of the gaps between the first support bars SB1_2 is greater than each of the gaps between the second support bars SB, and the widths of the first support bars SB1_2 decrease toward the central portion CTP of the first area AA1, a surface area on which the first support bars SB1_2 are disposed may be reduced toward the central portion CTP. Thus, stress in the first area AA1 of the display module DM wound around the roller ROL may be effectively reduced.

Figure 16:
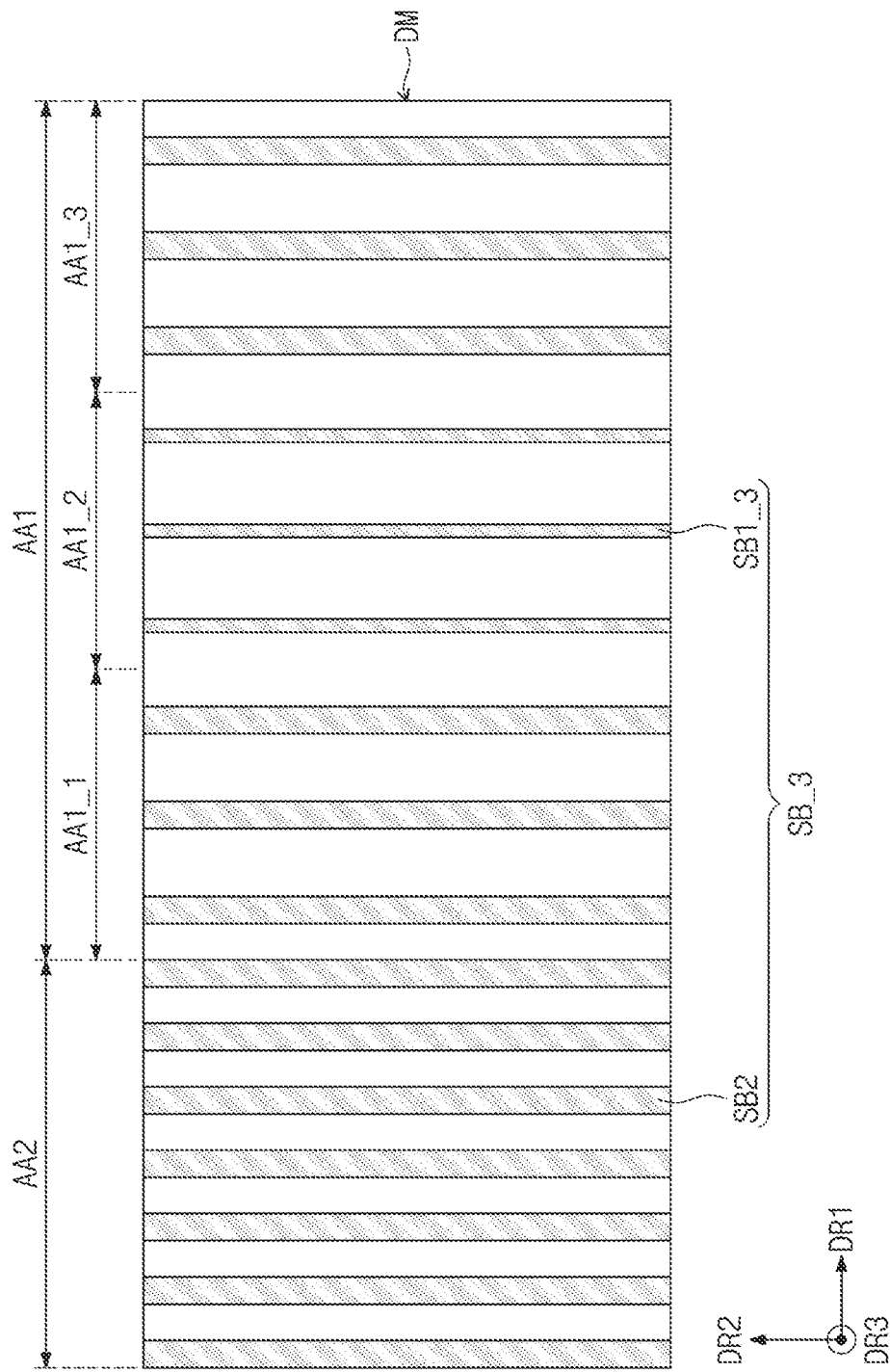
FIG. 16 is a plan view of a display apparatus according to yet another embodiment of the present invention.

FIG. 16 is a plan view of a display apparatus according to yet another embodiment of the present invention.

Hereinafter, constituents of support bars SB_3 illustrated in FIG. 16 will be mainly described with reference to constituents different from those of the support bars SB illustrated in FIG. 13, and the same constituent will be illustrated using the same reference numeral.

Referring to FIG. 16, the support bars SB_3 may include a plurality of first support bars SB1_3 disposed in a first area AA1 and a plurality of second support bars SB2 disposed in a second area AA2. Each of the gaps between the first support bars SB1_3 may be greater than each of the gaps between the second support bars SB2. The first support bars SB1_3 may be equally spaced from each other and arranged in the first direction DR1.

The first area AA1 may include a first sub area AA1_1, a second sub area AA1_2, and a third sub area AA1_3, which are arranged in the first direction DR1. The second sub area AA1_2 may be disposed between the first sub area AA1_1 and the third sub area AA1_3. A width of each of the first support bars SB1_3 disposed on the second sub area AA1_2 may be less than a width of each of the first support bars SB1_3 disposed on the first sub area AA1_1 and the third sub area AA1_3.

Although not shown, the thicknesses of the first support bars SB1_3 may be the same, and each of the first support bars SB1_3 may have the same thickness as each of the second support bars SB2.

FIGS. 17 to 20 are views illustrating thicknesses of support bars according to various embodiments of the present invention.

For convenience of explanation, FIGS. 17 to 20 are side views of first support bars SB1_4 SB1_5, SB1_6, and SB1_7 when viewed in the second direction DR2, and a second support bar SB2 is substantially the same as the second support bars SB2 illustrated in FIGS. 13 to 16, and thus omitted in FIGS. 17 to 20.

Referring to FIG. 17, the first support bars SB1_4 may be spaced apart from each other at equal gaps and arranged in the first direction DR1. That is, gaps between the first support bars SB1_4 may be uniform. The first support bars SB1_4 may have the same width in the first direction DR1. Thicknesses of the first support bars SB1_4 may vary according to areas of a display module DM.

The thicknesses of the first support bars SB1_4 may gradually decrease from opposite sides of a first area AA1 toward the central portion CTP of the first area AA1. The thicknesses of the first support bars SB1_4 may vary to be symmetrical to each other with respect to the central portion CTP of the first area AA1 in the first direction DR1.

Stress may be proportional to the thicknesses of the first support bars SB1_4. Thus, as the thicknesses of the first support bars SB1_4 decrease toward the central portion CTP, the stress in the first area AA1 of the display module DM wound around the roller ROL may be effectively reduced.

Referring to FIG. 18, widths of the first support bars SB1_5 and gaps between the first support bars SB1_5 in the first direction LORI may be substantially the same as those of the first support bars SB1 illustrated in FIG. 13. For example, the first support bars SB1_5 may have the same width, and the gaps between the first support bars SB1_5 may gradually increase from opposite sides of the first area AA1 toward the central portion CTP of the first area AA1.

The thicknesses of the first support bars SB1_5 may gradually decrease from both the opposite sides of the first area AA1 toward the central portion CTP of the first area AA1. The thicknesses of the first support bars SB1_5 may vary to be symmetrical to each other with respect to the central portion CTP of the first area AA1 in the first direction DR1. Thus, the stress of the first area AA1 wound around the roller ROL may be effectively reduced.

Referring to FIG. 19, gaps between the first support bars SB1_6 in the first direction DR1 may be substantially the same as the gaps of the first support bars SB1_1 illustrated in FIG. 14. However, widths of the first support bars SB1_6 may gradually decrease from opposite sides of the first area AA1 toward the central portion CTP of the first area AA1. Gaps between the first support bars SB1_6 may gradually increase from both the opposite sides of the first area AA1 toward the central portion CTP of the first area AA1.

Thicknesses of the first support bars SB1_6 may gradually decrease from both the opposite sides of the first area AA1 toward the central portion CTP of the first area AA1. The thicknesses of the first support bars SB1_6 may vary to be symmetrical to each other with respect to the central portion CTP of the first area AA1 in the first direction DR1.

Referring to FIG. 20, gaps between the first support bars SB1_7 may be substantially the same as the gap of the first support bars SB1_2 illustrated in FIG. 15. For example, the first support bars SB1_7 may have the same gap and be arranged in the first direction DR1. However, widths of the first support bars SB1_7 may gradually decrease from both the opposite sides of the first area. AA1 toward the central portion of the first area AA1.

Thicknesses of the first support bars SB1_7 may gradually decrease from both the opposite sides of the first area AA1 toward the central portion CTP of the first area AA1. The thicknesses of the first support bars SB1_7 may vary to be symmetrical to each other with respect to the central portion CTP of the first area AA1 in the first direction DR1.

FIGS. 21 to 27 are views for explaining a method for manufacturing a display device according to an embodiment of the present invention.

For convenience of explanation, FIGS. 21 to 27 are side views when viewed in the second direction DR2.

Figure 21:
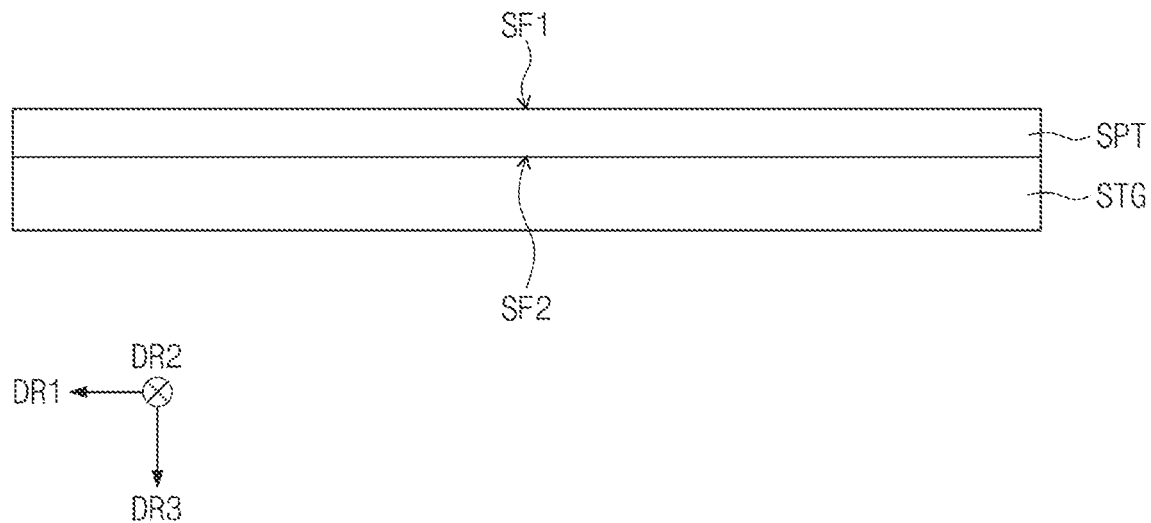
FIGS. 21 to 27 are views for explaining a method for manufacturing a display device according to an embodiment of the present invention.

Referring to FIG. 21, a support plate SPT may be disposed on a stage STG. The support plate SPT may include a metal. A top surface of the support plate SPT may be defined as a first surface SF1, and a bottom surface of the support plate SPT facing the stage STG may be defined as a second surface SF2. Each of the stage STG and the support plate SPT may have a plane defined by the first and second directions DR1 and DR2. The first surface SF1 and the second surface SF2 are parallel to the plane above.

Figure 22:
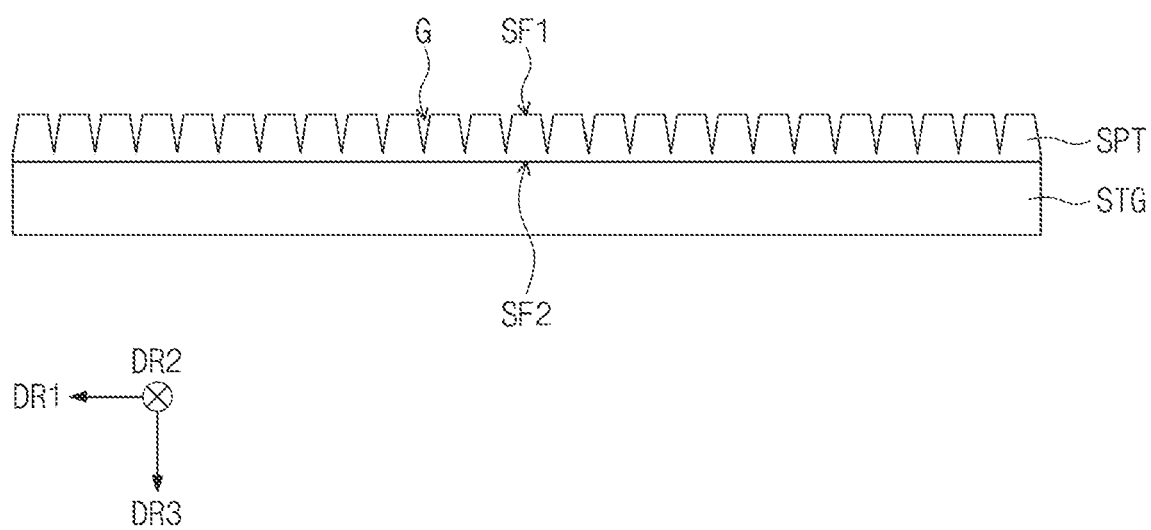

Referring to FIG. 22, a plurality of grooves G arranged in the first direction DR1 and extending in the second direction DR2 may be defined in the first surface of the support plate SPT. The grooves G may be defined in the support plate SPT in various manners. For example, the grooves G may be defined in the support plate SPT using a knife or a laser.

Figure 23:
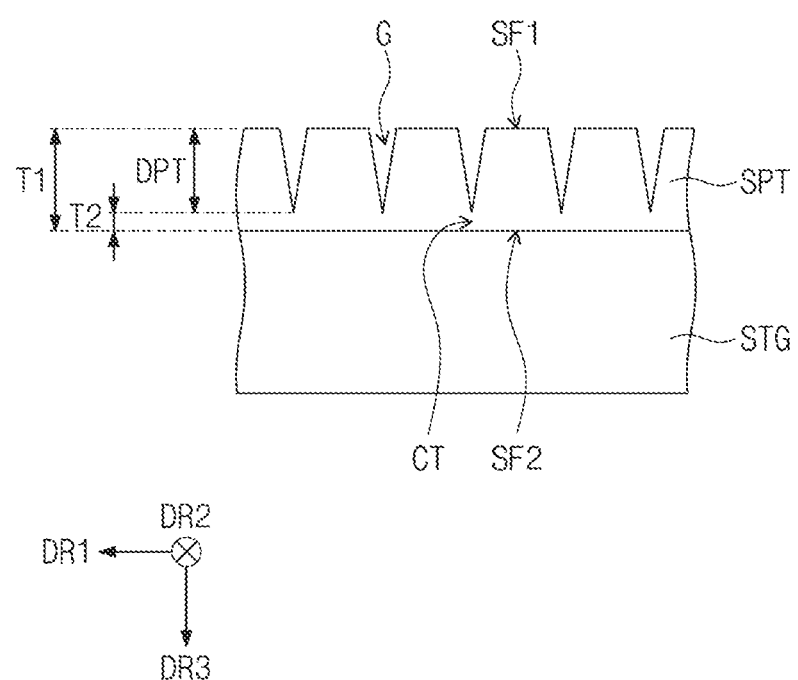

FIG. 23 is an enlarged view illustrating a portion of the support plate SPT illustrated in FIG. 22.

Referring to FIG. 23, the support plate SPT may have a first thickness T1 in the third direction DR3. The first thickness T1 of the support plate SPT may be defined as a distance between the first surface SF1 and the second surface SF2 of the support plate SPT, which is measured in the third direction DR3. A depth DPT of each of the grooves G may be $4/5$ to $19/20$ of the first thickness T1 in the third direction DR3.

Portions of the support plate SPT in which the grooves G are defined may be defined as cut portions CT A second thickness T2 of each of the cut portions CT may be $1/5$ to $1/20$ of the first thickness T1 in the third direction DR3. When the first thickness T1 is 400 micrometers, the depth DPT may be 320 micrometers to 380 micrometers, and the second thickness T2 may be 80 micrometers to 20 micrometers.

Figure 24:
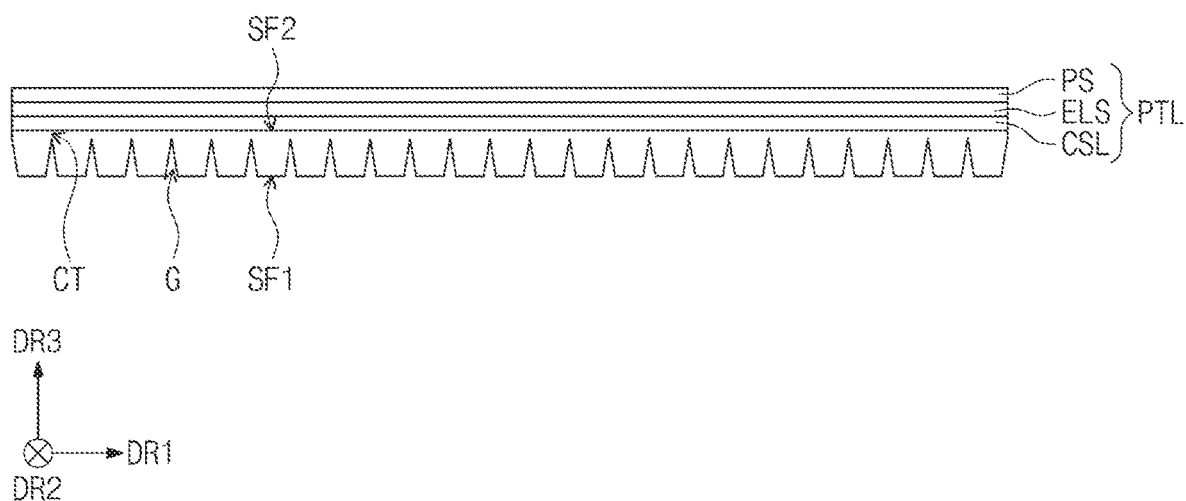

Referring to FIG. 24, the support plate SPT may be disposed so that the second surface SF2 of the support plate SPT faces an upper side, and the first surface SF1 of the support plate SPT faces a lower side. A protective layer PTL may be disposed on the second surface SF2 of the support plate SPT. The protective layer PTL may refer to the protective layer PTL illustrated in FIG. 3.

The protective layer PTL may be attached to the second surface SF2. For example, a pressure-sensitive adhesive may be disposed between the protective layer PTL and the second surface SF2 to attach the protective layer PTL and the support plate SPT to each other. In order to attach the protective layer PTL to the support plate SPT through the pressure-sensitive adhesive, the protective layer PTL may be pressed toward the support plate SPT.

Figure 25:
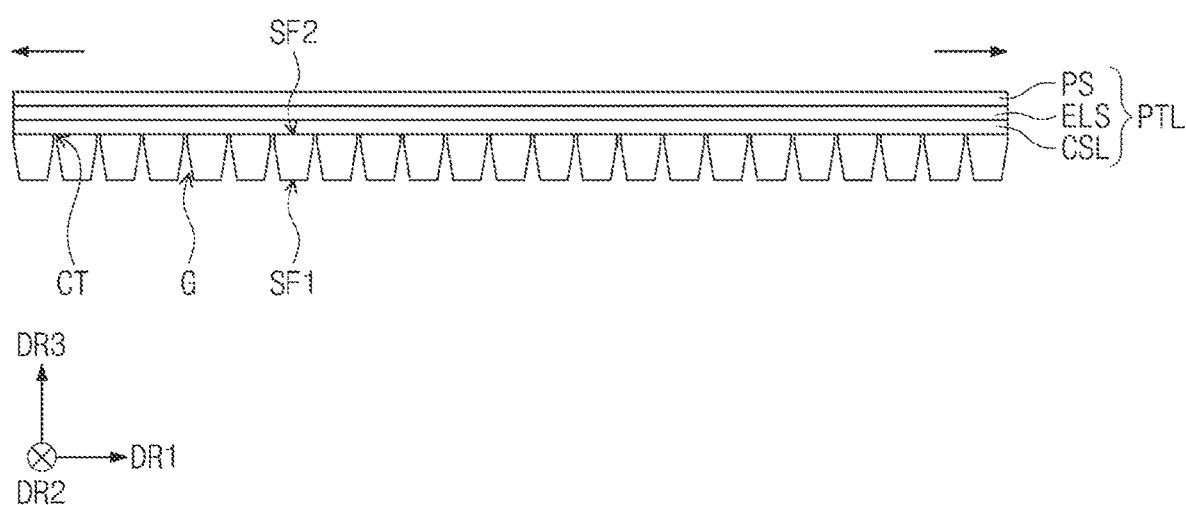
Figure 26:
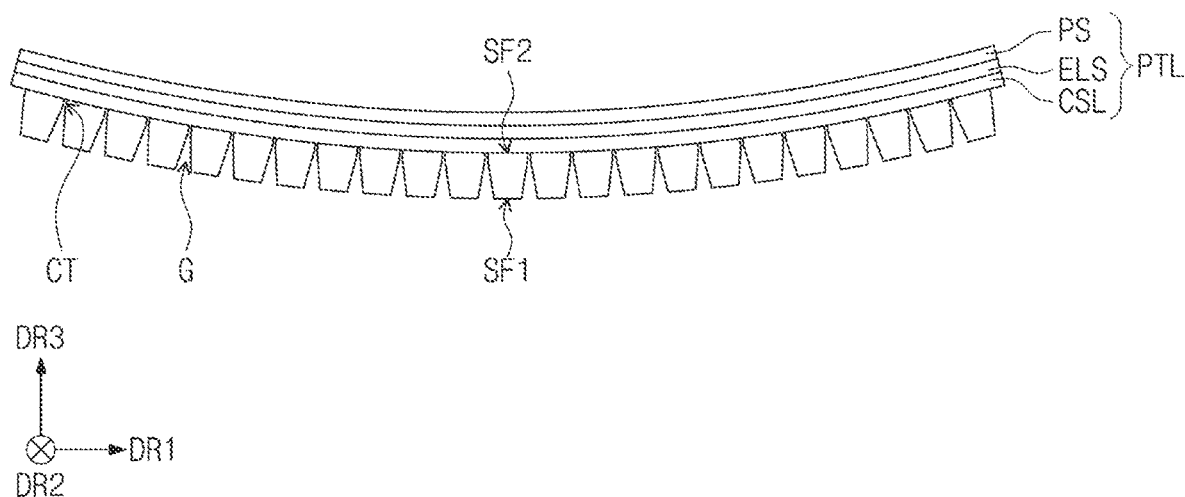

Referring to FIGS. 25 and 26, each of the protective layer PTL and the support plate SPT may be tensioned in the first direction DR1. In addition, the protective layer PTL and the support plate SPT may be bent so that the top surface of the protective layer PTL is concave with respect to the first direction DR1. Cracks may be formed in the cut portions CT, and thus the cut portions CT may be cut due to an operation of tensioning and bending the protective layer PTL and the support plate SPT.

For example, the tensile operation and the bending operation have been described together, but if the cut portions CT are cut by any one operation, the other operation may be omitted.

Figure 27:
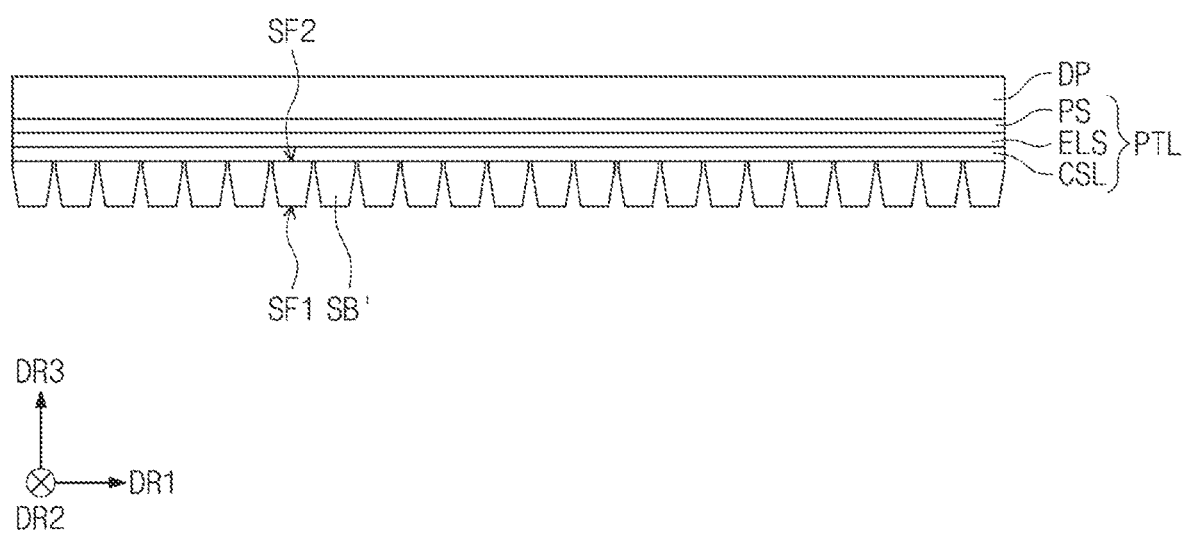

Referring to FIG. 27, the cut portions CT may be separated from each other to form a plurality of support bars SB' under the protective layer PTL. Before the support bars SB' are formed, the protective layer PTL may be first pressed to the support plate STP so as to be attached to the support plate STP, and then the support bars SB' may be formed. A display panel DP may be attached to the top surface of the protective layer PTL, which is an opposite surface of the bottom surface of the protective layer PTL, to which the support bars SB' are attached, to manufacture a display device.

Instead of manufacturing the support bars SB' using the support plate SPT, the support bars may be individually first manufactured, and then the support bars may be attached to the bottom surface of the protective layer PTL by a pressure-sensitive adhesive. When the support bars are attached to the protective layer PTL, the protective layer PTL may be pressed toward the support bars.

When the support bars are spaced apart from each other, and the protective layer PTL is pressed toward the support bars, portions of the protective layer PTL, which overlap the support bars, may be pressed between the support bars and recessed between the support bars. In this case, top surfaces of portions of the protective layer PTL pressed between the support bars may also be recessed downward. Thus, the top surface of the protective layer PTL may not have a flat surface, and the display panel DP disposed on the protective layer PTL may also not be flat. That is, a surface quality of the display module may be deteriorated.

In an embodiment of the present invention, the protective layer PTL may be first attached to the flat second surface SF2 before the support bars SB' are formed, and then the support bars SB' may be formed. Thus, the protective layer PTL may be maintained in the flat state. Thus, the surface quality of the display module may be improved, FIG. 28 FIG. 29 are perspective views of a display device according to another embodiment of the present invention.

Figure 28:
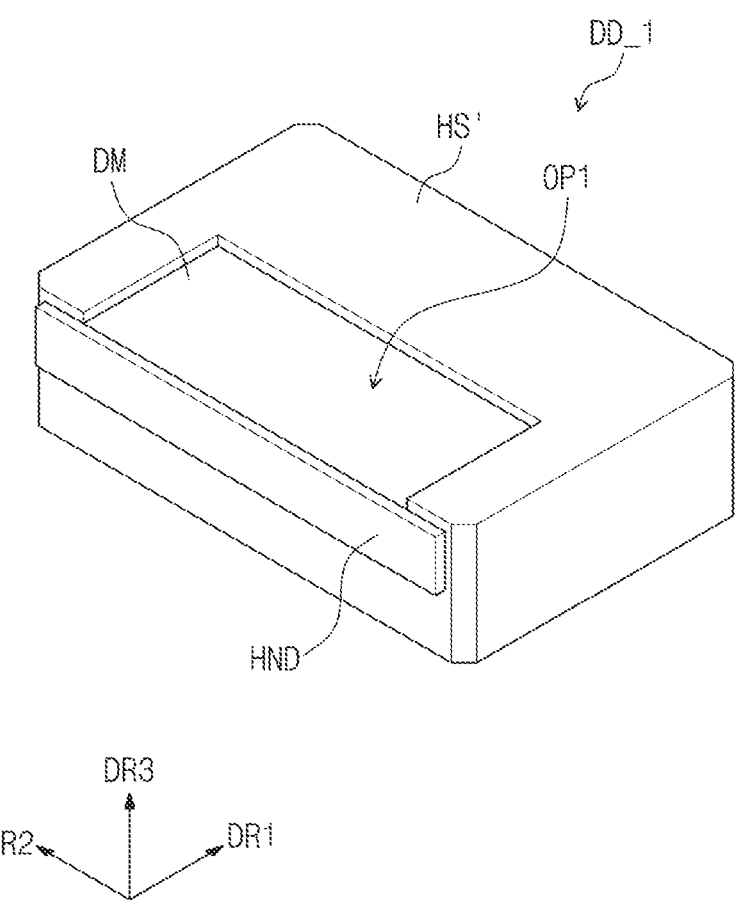
FIG. 28 FIG. 29 are perspective views of a display device according to another embodiment of the present invention.
Figure 29:
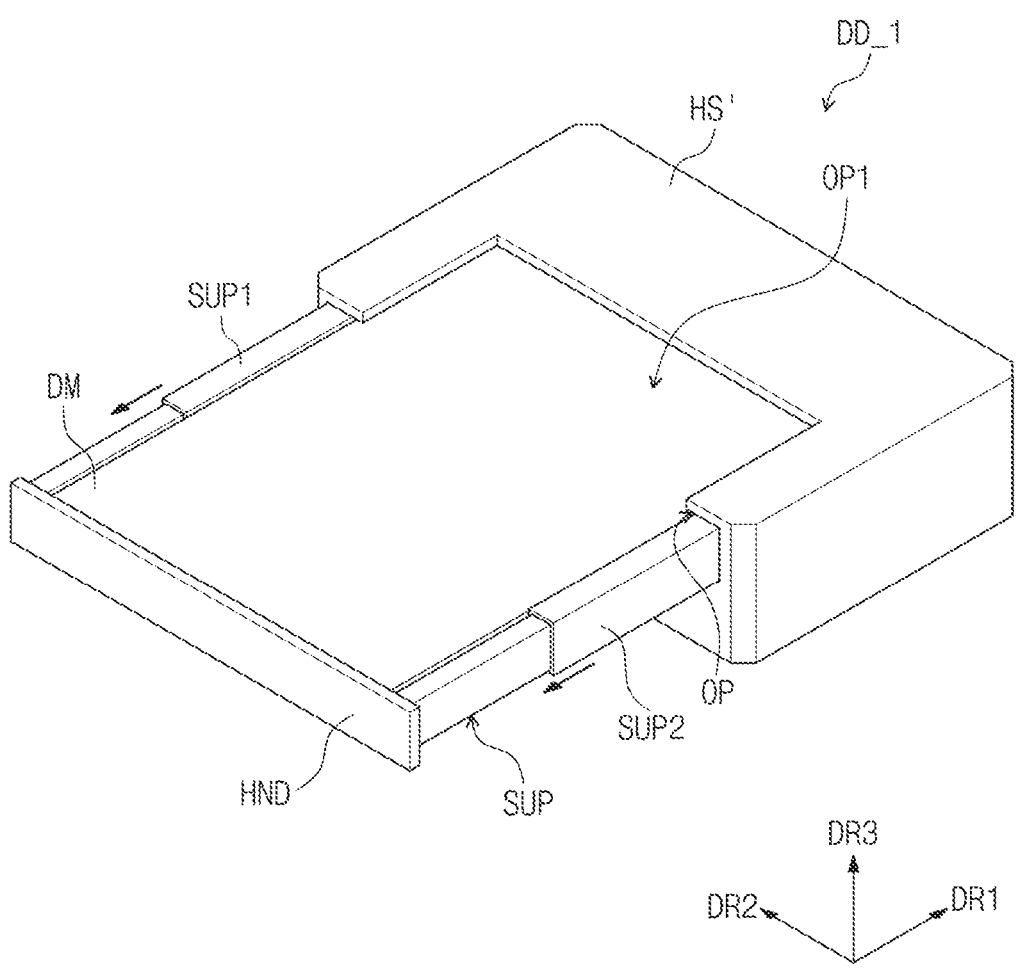

Except for constituents of the housing HS', a display device DD_1 illustrated in FIGS. 28 and 29 may have the same constituent as the display device DD illustrated in FIGS. 1 and 2. Thus, the constituents of the housing HS' will be described below.

Referring to FIGS. 28 and 29, a first opening OP1 exposing a predetermined portion of a display module DM may be defined on a top surface of the housing HS'. The first opening OP1 may be adjacent to a handle HND. The first opening OP1 may be continuously defined from the opening OP through which the display module DM is inserted and withdrawn from the housing HS'.

Referring to FIG. 28, in a closed mode, an image may be displayed through a portion of the display module DM, which is exposed through the first opening OP1. In the closed mode of the display device DD illustrated in FIG. 1, the entire display modules DM may be closed within the housing. On the contrary, in the closed mode of the display device DD_1 illustrated in FIG. 28, a portion of the display module DM may be exposed to the outside.

Referring to FIG. 29, in the open mode, the exposed portion of the display module DM may be expanded.

It will be apparent to those skilled in the art that various modifications and variations can be made in the present invention. Thus, it is intended that the present invention covers the modifications and variations of this invention provided they come within the scope of the appended claims and their equivalents. Thus, to the maximum extent allowed by law, the scope of the present invention is to be determined by the broadest permissible interpretation of the following claims and their equivalents, and shall not be restricted or limited by the foregoing detailed description.

INDUSTRIAL APPLICABILITY

The possibility of manufacturing a defective display module may be effectively reduced due to the reduction of the stress of the display module wound around the roller, and thus, since this is a technology capable of improving yield of the display device, the present invention has high industrial applicability.

The invention claimed is:

1. A display device comprising:
   a display module;
   a plurality of support bars disposed on a rear surface of the display module;
   a roller which is connected to one end of the display module and around which the display module and part of the plurality of support bars are wound; and
   a housing which accommodates the display module, the plurality of support bars, and the roller,
   wherein gaps between the plurality of support bars vary according to areas of the display module in a state that the display module is unfolded.

2. The display device of claim 1, wherein the display module extends in a first direction, and the plurality of support bars extend in a second direction crossing the first direction and are arranged to be spaced apart from each other in the first direction.

3. The display device of claim 2, wherein the display module comprises:
   a first area wound around the roller; and
   a second area which is not wound around the roller,
   wherein the plurality of support bars comprise:
   a plurality of first support bars disposed on a bottom surface of the first area and wound around the roller; and
   a plurality of second support bars disposed on a bottom surface of the second area.

4. The display device of claim 3, wherein a gap between first support bars, which are disposed at a central portion of the first area, among the plurality of first support bars is greater than each of gaps between first support bars, which are disposed at portions adjacent to opposite sides of the first area, among the plurality of first support bars.

5. The display device of claim 3, wherein each of gaps between the plurality of first support bars are greater than each of gaps between the plurality of second support bars.

6. The display device of claim 3, wherein gaps between the plurality of first support bars in the first direction gradually increase from opposite sides of the first area, spaced apart in the first direction, toward a central portion of the first area.

7. The display device of claim 6, wherein the gaps between the plurality of first support bars vary to be symmetrical to each other with respect to the central portion of the first area in the first direction.

8. The display device of claim 6, wherein the plurality of first support bars and the plurality of second support bars have same width, and the plurality of second support bars are spaced apart from each other at equal gaps in the first direction.

9. The display device of claim 3, wherein gaps between the plurality of first support bars in the first direction gradually increase from opposite sides of the first area, spaced apart in the first direction, toward a central portion of the first area, and
widths of the plurality of first support bars in the first direction gradually decrease from the opposite sides of the first area toward the central portion of the first area.

10. The display device of claim 3, wherein the plurality of first support bars are spaced apart from each other at equal gaps in the first direction, and widths of the plurality of first support bars in the first direction gradually decrease from opposite sides of the first area, spaced apart in the first direction, toward a central portion of the first area.

11. The display device of claim 3, wherein the first area comprises a first sub area, a second sub area, and a third sub area, which are arranged in the first direction,
wherein the second sub area is disposed between the first sub area and the third sub area, and
a width of the first support bar disposed on the second sub area among the plurality of first support bars is less than a width of each of the first support bars disposed on the first and third sub areas.

12. The display device of claim 3, wherein gaps between the plurality of first support bars gradually increase from opposite sides of the first area, spaced apart in the first direction, toward a central portion of the first area, and
thicknesses of the plurality of first support bars gradually decrease from the opposite sides of the first area toward the central portion of the first area.

13. The display device of claim 3, wherein gaps between the plurality of first support bars gradually increase from opposite sides of the first area, spaced apart in the first direction, toward a central portion of the first area, and widths of the plurality of first support bars in the first direction gradually decrease from the opposite sides of the first area toward the central portion of the first area, and
thicknesses of the plurality of first support bars gradually decrease from the opposite sides of the first area toward the central portion of the first area.

14. The display device of claim 3, wherein the plurality of first support bars are spaced apart from each other at equal gaps in the first direction, and widths of the plurality of first support bars gradually decrease from opposite sides of the first area, spaced apart in the first direction, toward a central portion of the first area, and
thicknesses of the plurality of first support bars gradually decrease from the opposite sides of the first area toward the central portion of the first area.

15. The display device of claim 2, further comprising a first support and a second support, which extend in the first direction and are spaced apart from each other in the second direction,
wherein the first support and the second support are configured to support a first side and a second side of each of the plurality of support bars, which are opposite to each other in the second direction, respectively, and the display module is disposed between the first support and the second support.

16. The display device of claim 15, wherein the first side and the second side of each of the plurality of support bars are disposed in guide grooves defined in an inner surface of the first support and an inner surface of the second support facing each other, respectively, and the plurality of support bars move in the first direction along the guide grooves.

17. The display device of claim 15, wherein, when the display module is withdrawn from the housing, the first and second supports are expanded to an outside of the housing.

18. A display device comprising:
a display module extending in a first direction;
a plurality of support bars disposed on a rear surface of the display module, extending in a second direction crossing the first direction, and arranged to be spaced apart from each other in the first direction;
a roller which is connected to one end of the display module and around which the display module and part of the plurality of support bars are wound; and
a housing which accommodate the display module, the support bars, and the roller,
wherein an opening, through which the display module and the support bars are inserted and withdrawn, is defined in the housing,
wherein thicknesses of the plurality of support bars vary according to areas of the display module.

19. The display device of claim 18, wherein the display module comprises:
a first area wound around the roller; and
a second area which is not wound around the roller,
wherein the plurality of support bars comprise:
a plurality of first support bars disposed on a bottom surface of the first area and wound around the roller; and
a plurality of second support bars disposed on a bottom surface of the second area.

20. The display device of claim 19, wherein the plurality of first support bars are spaced apart from each other at equal gaps in the first direction, and the thicknesses of the plurality of first support bars gradually decrease from opposite sides of the first area, spaced apart in the first direction, toward a central portion of the first area.

21. A method for manufacturing a display device, comprising:
forming a plurality of grooves, which are arranged in a first direction and extend in a second direction crossing the first direction, in a first surface of a support plate;
attaching a protective layer to a second surface of the support plate, which is an opposite surface of the first surface;
after attaching the protective layer to the second surface, applying tensile force to the protective layer and the support plate to cut portions of the support plate, in which the plurality of grooves are formed, so that a plurality of support bars spaced apart from each other in the first direction are formed; and
attaching a display panel to a top surface of the protective layer, which is an opposite surface of a bottom surface of the protective layer, wherein the plurality of support bars are attached to the bottom surface.

22. The method of claim 21, wherein the plurality of support bars is formed by bending the protective layer and the support plate so that the top surface of the protective layer is concave with respect to the first direction.

23. The method of claim 21, wherein each of the grooves has a depth corresponding to $4/5$ to $19/20$ of a thickness of the support plate.

* * * * *